United States Patent [19]
Davis et al.

[11] 4,362,486
[45] Dec. 7, 1982

[54] AUTOMATIC MULTILAYER CERAMIC (MLC) SCREENING MACHINE

[75] Inventors: Gordon T. Davis, Pompano Beach, Fla.; Edward H. Faulkner, Pleasant Valley, N.Y.; Angelo S. Gasparri, Coral Springs, Fla.; Robert A. Magee, Poughkeepsie, N.Y.; Lawrence P. Remsen, Stanfordville, N.Y.; Dennis L. Saylor, Lagrangeville, N.Y.; Alfred A. Stricker, Pompano Beach, Fla.

[73] Assignee: International Business Machines Corporation, Armonk, N.Y.

[21] Appl. No.: 194,724

[22] Filed: Oct. 7, 1980

[51] Int. Cl.³ .................... B29C 27/00; B29E 6/00
[52] U.S. Cl. .............................. 425/110; 425/129 R; 425/126 R; 425/811; 271/98; 271/108
[58] Field of Search ................. 425/110, 811, 126 R, 425/129 R, 229, 261, 810; 271/98, 108

[56] References Cited

U.S. PATENT DOCUMENTS

| | | | |
|---|---|---|---|
| 3,682,815 | 1/1975 | Rocsynski et al. | 425/810 |
| 4,011,035 | 3/1977 | Root | 425/129 R X |
| 4,068,994 | 1/1978 | Cadwalder et al. | 425/110 |
| 4,185,814 | 1/1980 | Buchmann et al. | 271/108 |
| 4,186,918 | 2/1980 | Ficker et al. | 271/98 X |
| 4,284,396 | 8/1981 | Thissen et al. | 425/397 X |

Primary Examiner—J. Howard Flint, Jr.
Attorney, Agent, or Firm—Sughrue, Mion, Zinn, Macpeak & Seas

[57] ABSTRACT

Vertically displaceable green sheet support fixtures are borne by respective horizontally movable carriages traveling on common rails between respective dual loading stations and a common unloading station, through separate intermediate screening stations, with the carriages movable in opposite directions and out of phase stationwise. The carriages have fixedly coupled thereto, horizontally movable trailers which bear trays of stacked green sheets for selective transfer of the uppermost green sheet to a loading head at the loading station while the carriage borne fixture itself is at a screening station for paste screening of a prior transferred green sheet. Masks employed in screen printing at the screening station are removed from the screening station console and placed in a cleaning chamber for solvent removal of residual screening paste and are air dried prior to return to the screening station console. During cleaning of a dirty mask, a second clean mask is automatically presented at the station to eliminate throughput-loss. The fixture is vertically displaceable on the carriage and its height incrementally varied depending upon green sheet thickness variation. Accelerated vertical separation of the carriage borne green sheet from the mask is effected subsequent to initial slow incremental separation therebetween.

21 Claims, 23 Drawing Figures

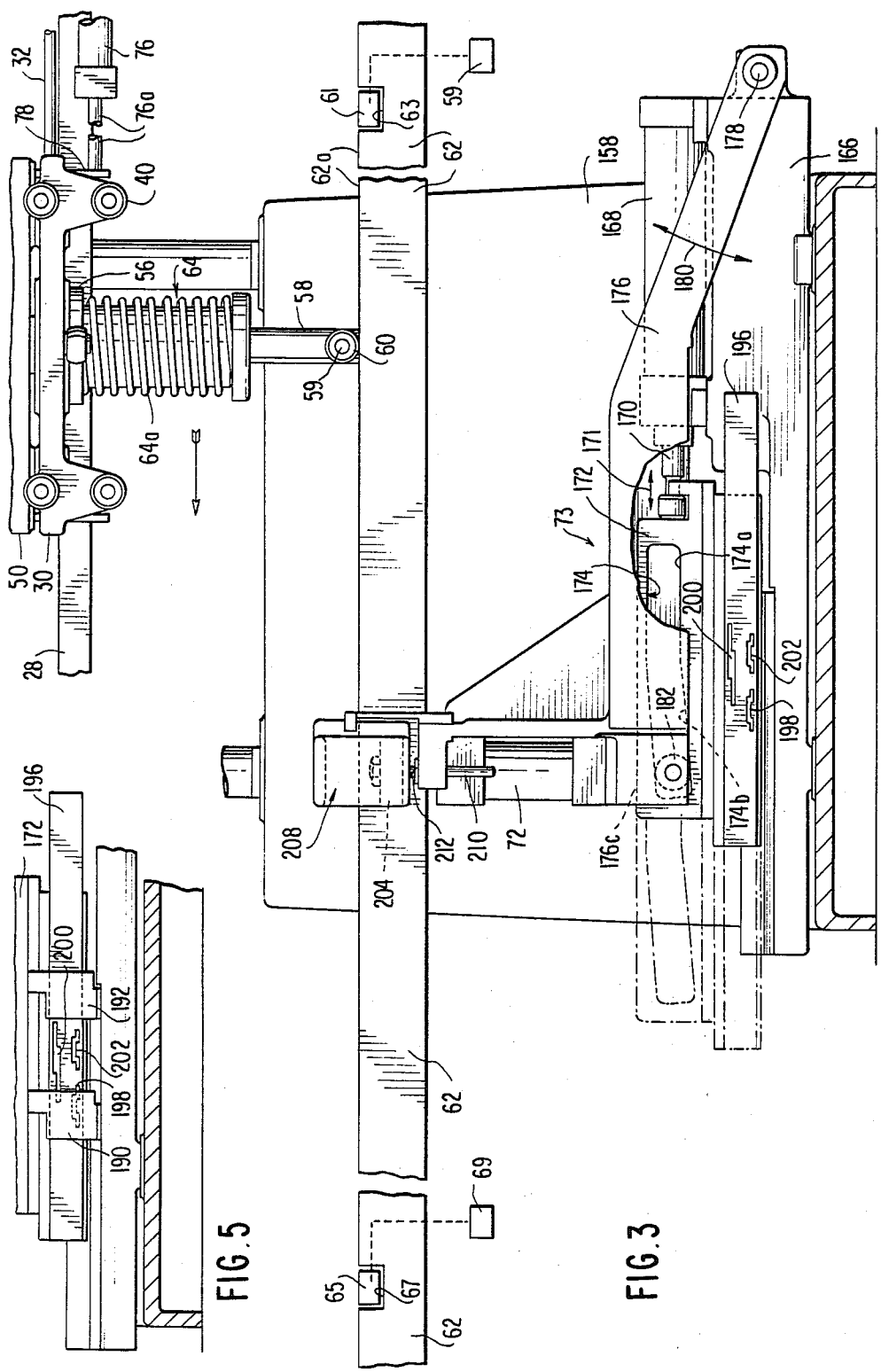

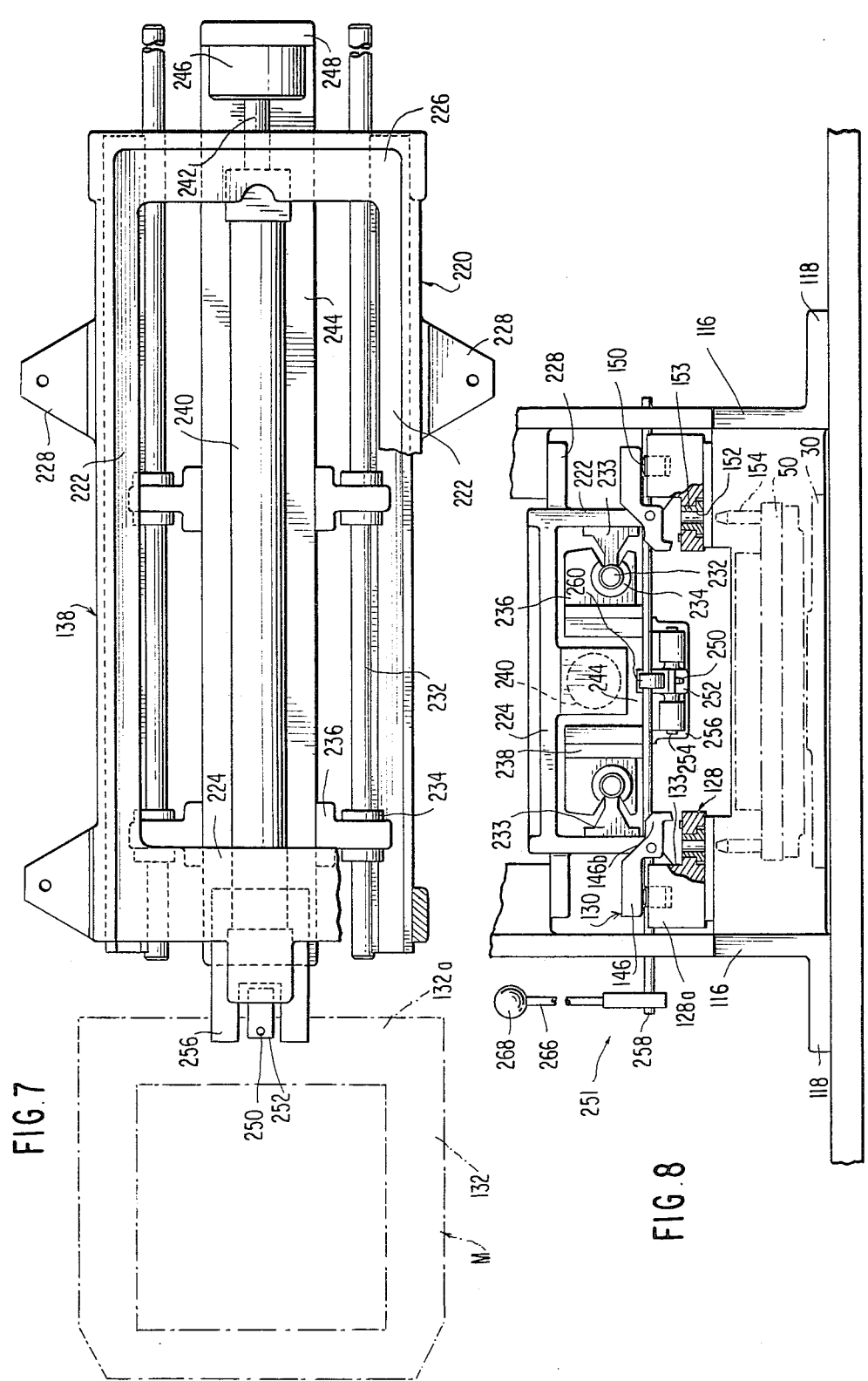

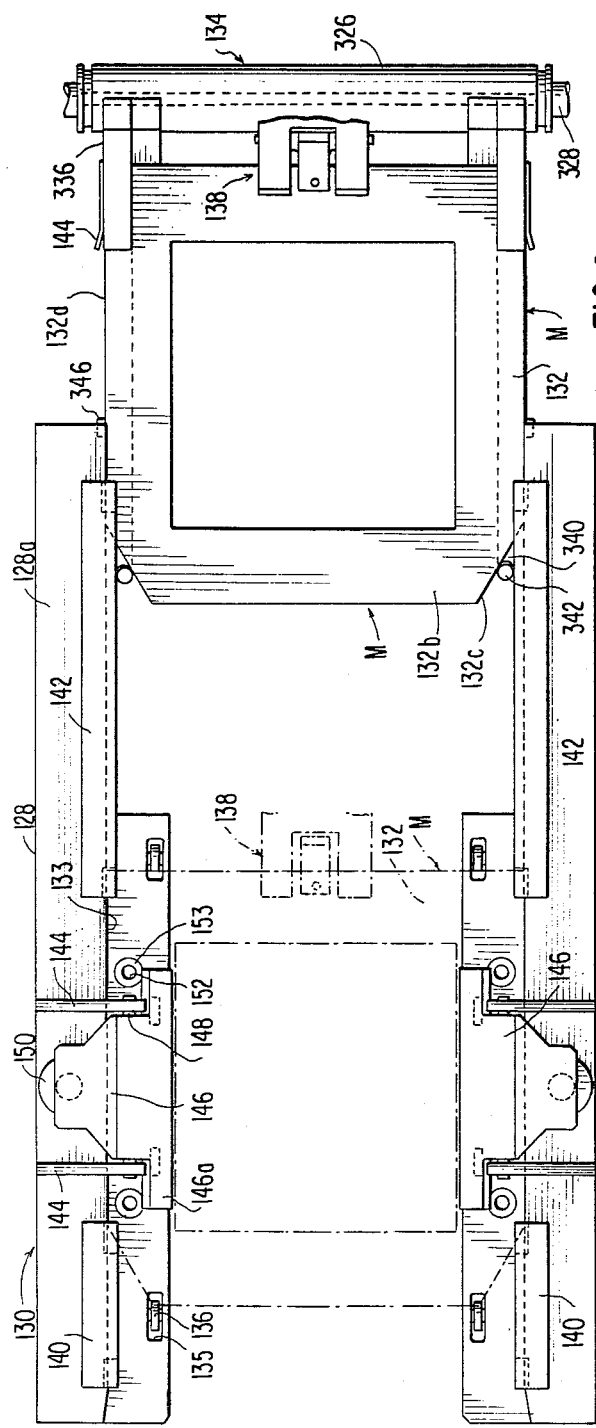
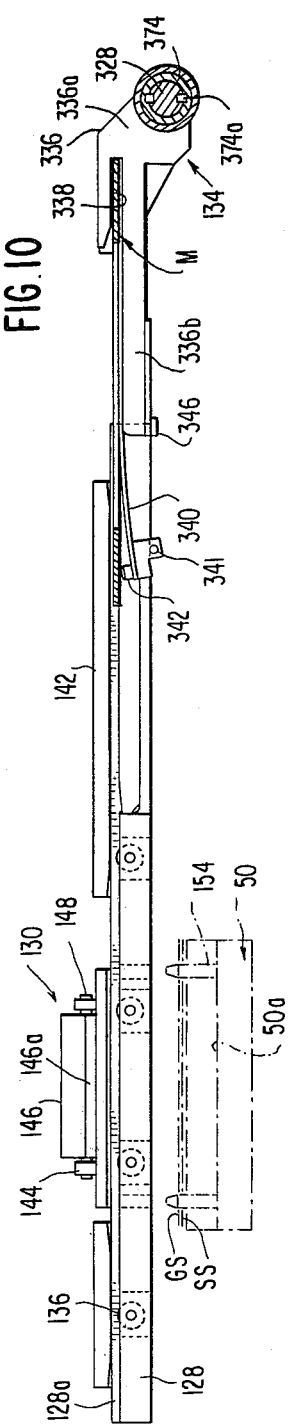
FIG. 9
FIG. 10

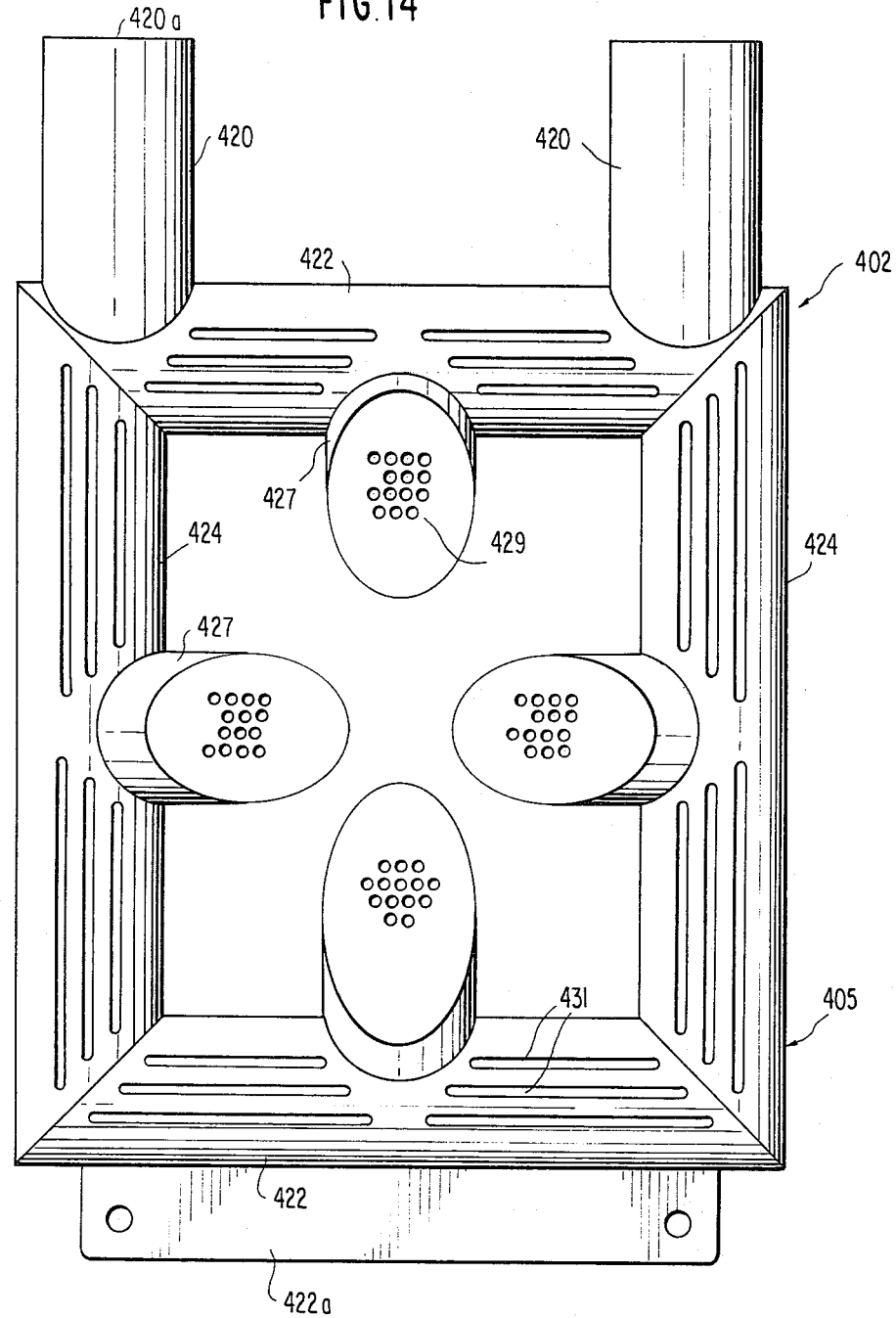

FIG. 17A

| RIGHT HAND HALF | SECONDS → | 0 | 2 | 4 | 6 | 8 | 10 | 12 | 14 | 16 | 18 | 20 | 22 | 24 | 26 | 28 | 30 | 32 | 34 | 36 | 38 | 40 | 42 | 44 | 46 |
|---|---|---|---|---|---|---|---|---|---|---|---|---|---|---|---|---|---|---|---|---|---|---|---|---|---|
| 1 | FIXTURE UP | | | | | | | ■ | | | | | | | | | | | | | | | | | |
| 2 | FIXTURE VAC. OFF UNL. HD. ON | | | | | | | | ■ | | | | | | | | | | | | | | | | |
| 3 | XFER G/S & B.P. TO UNL. HD. | | | | | | | | ■ | | | | | | | | | | | | | | | | |
| 4 | FIXTURE DOWN | | | | | | | | | ■ | | | | | | | | | | | | | | | |
| 5 | SHUT. UNL. HD. OUT & ROT. 90° | | | | | | | | | | ■ | | | | | | | | | | | | | | |
| 6 | IND. FIXTURE 40" TO #14 | | | | | | | | | | ■ | | | | | | | | | | | | | | |
| 7 | CLEAN FIXT. (DURING INDEX) | | | | | | | | | | | ■ | | | | | | | | | | | | | |
| 8 | STRIP B/P (MANUAL) | | | | | | | | | | | | | ■ | | | | | | | | | | | |
| 9 | ROTATE UNL. HD. 90° (MANUAL) | | | | | | | | | | | | | | ■ | | | | | | | | | | |
| 10 | XFER G/S TO DRYER TRAY | | | | | | | | | | | | | | ■ | | | | | | | | | | |
| 11 | SHUT. UNL. HD. BACK | | | | | | | | | | | | | | | ■ | | | | | | | | | |
| 12 | PLACE GS/SS TRAY ON TRAILER | | | | | | | | | | | | | | | | | | | ■ | | | | | |
| 13 | VAC/AIR ON PINS UP | | | | | | | | | | | | ■ | | | | | | | | | | | | |
| 14 | G/S LOAD HD. DOWN | | | | | | | | | | | | | | ■ | | | | | | | | | | |
| 15 | ALIGN G/S & B/P ON FIXTURE | | | | | | | | | | | | | | | ■ | | | | | | | | | |
| 16 | VAC. ON PINS DOWN | | | | | | | | | | | | | | | ■ | | | | | | | | | |
| 17 | INDEX 20" (TO SCRN. STA.) | | | | | | | | | | | | | | | | ■ | | | | | | | | |
| 18 | CLEAN G/S DURING INDEX | | | | | | | | | | | | | | | | | ■ | | | | | | | |
| 19 | LOAD HD. VAC. ON | | | | | | | | | | | | | | | | | | ■ | | | | | | |
| 20 | LOAD HD. DOWN | | | | | | | | | | | | | | | | | | ■ | | | | | | |
| 21 | XFER G/S & B/P FROM 1" SCRN. TRAY | | | | | | | | | | | | | | | | | | | ■ | | | | | |
| 22 | LOAD HD. UP | | | | | | | | | | | | | | | | | | ■ | | | | | | |
| 23 | MASK UNLOAD | | | | | | | | | | ■ | | | | | | | | | | | | | | |

AUTOMATIC MULTILAYER CERAMIC (MLC) SCREENING MACHINE

RELATED PATENTS AND APPLICATIONS

U.S. Pat. No. 4,068,994 issued Jan. 17, 1978, entitled "Apparatus for Printing of Ceramic Green Sheets" by R. H. Cadwalder et al, and assigned to International Business Machines Corporation.

U.S. Pat. No. 4,185,814 issued Jan. 29, 1980, entitled "Pick Up and Placement Head for Green Sheet and Spacer" by Buchmann et al. and assigned to International Business Machines Corporation.

U.S. Pat. No. 4,186,918 issued Feb. 8, 1980, entitled "Method and Apparatus for Locating and Aligning Flimsy Sheets" by Walter W. Ficker et al and assigned to International Business Machines Corporation.

FIELD OF THE INVENTION

This invention relates to screening machines for paste screening of green sheets and more particularly to an automatic screening machine for effecting simultaneous screening of multiple green sheets under synchronized control.

DESCRIPTION OF THE PRIOR ART

Multilayer ceramic semiconductor packages have been formed by stacking and bonding together flexible paperlike sheets commonly referred to as ceramic green sheets. Green sheet segments of desired size and configuration are punched to provide via holes and, by a screen printing technique, a conductive paste fills the via holes and/or a conductive circuit pattern is applied to the face of the green sheet as required. Such green sheets, after screening, are assembled in a stack, pressed and subsequently sintered in an oven at a relatively high temperature. Upon sintering, the vehicle and any binder material are burned off with the remaining rigid unitary ceramic body provided with interior interconnected conductive patterns. Additional processing occurs prior to the units being encapsulated.

Critical to the manufacturing process is the screening operation since the ceramic green sheets are relatively fragile, their thickness may be on the order of 0.008 inches, and their surface area is relatively large compared to their thickness.

In an attempt to automate the screen printing of the ceramic green sheets, a screening machine was devised as set forth in the above identified U.S. Pat. No. 4,068,994 having a single combined load/unload station and a single horizontally displaced screening station. The load/unload station is of a manual, one-sheet-at-a-time type and requires the machine operator to manually place and remove each green sheet on the fixture or platform assembly which is horizontally shifted from the load/unload station to a laterally displaced screening station. At that point, the green sheet is raised vertically via its support fixture and underlies and is centered with the screening station components. The machine of that patent is further characterized by a support fixture or carriage of the vacuum head type such that the green sheet is by vacuum pressure, maintained flat and in contact with the top of the carrier. The operation of the screening machine of U.S. Pat. No. 4,068,994 is basically adequate to effect accurate screen printing pattern application to the fragile green sheets, but with the exception of the automatic transfer of the applied green sheet to the screening station and return to the load/unload station, the machine is essentially manually operated.

In order to insure accurate positioning of the ceramic green sheet underlying a pattern mask at the screening station, there has been developed a technique utilizing two head members members having their facing surfaces of porous material, and wherein selectively, vacuum pressure or positive air pressure is applied to such surfaces to facilitate, between these vertically shiftable, generally aligned head members, the transfer of a green sheet from an overlying pick up and placement head onto an underlying support fixture. The underlying fixture then places the green sheet into a proper screening position at the screening station. U.S. Pat. No. 4,186,918, preferred to above, teaches a sheet alignment technique wherein the green sheet which is picked up at a first location from a stack of green sheets is transported to a second location, under head vacuum pressure. Further, the underlying support member has means similar to the pick up and placement head, whereby, opposed positive air pressure zones are created such that the green sheet of the pick up and placement head, moves gravity wise toward the underlying support member or fixture. Alignment pins carried by underlying fixture move their bullet noses into sheet locator holes.

Such vacuum pick up and placement head may be of the type set forth in U.S. Pat. No. 4,185,814 identified above, in which the vacuum head is generally of rectangular configuration, having a peripheral sheet contact lip with vacuum slots formed through the periphery to support an underlying sheet by vacuum pressure. The center of the head contacting face may be recessed with the sheet in place acting as a diaphragm. Means may be provided to control the application of vacuum and positive air pressure to the head for selectively picking up the sheet, retaining it and forced air stripping of the sheet from the head. A plurality of probes may be provided in the pick up and placement head which are adapted to selectively project through the sheet contacting surface for detecting a green sheet and/or a spacer sheet (utilized in between layers of green sheets of the stack of such sheets). Further, the probes can act as positive mechanical strippers.

As may be appreciated by the above discussion regarding current techniques for processing and screening of ceramic green sheets, particular problems are encountered when screening such relatively soft and deformable paper thin, flexible green sheets which are of no concern to the general screen printing art utilizing rigid substrates.

Unfortunately, many types of MLC conductive paste, such as a molybdenum paste, screened onto the green sheets are not only difficult to work with, thus complicating the screening process itself, but the residual paste on the mask prevents mask utilization over multiple screening passes. This requires the mask to be cleaned after every pass or sweep of the paste nozzle across the face of the mask to effect screen printing of the underlying green sheet. In the past, this required the mask to by manually cleaned. This results in a very low processing rate for such screening machine as that of U.S. Pat. No. 4,068,994, even where some operations are achieved in an automated manner.

Therefore, it is a primary object of this invention to provide a new automatic screening machine for printing conductive patterns on ceramic green sheets in which individual green sheets are removed, one at a time from a stack borne by a loading tray, accurately positioned on a fixture for transport to the screening station, accurately aligned with the screener mask and subsequently transferred to an unloading station for automatically unloading and stacking, sequentially within a second, unloading tray.

It is a further object of this invention to provide such fully automatic green sheet screening machine in which multiple green sheets can be simultaneously processed along multiple process paths and wherein screened green sheets from dual paths are fed sequentially to a common unloading station.

It is a further object of this invention to provide such automatic, multi processing path, green sheet screening machines, in which the fixture and the green sheet printing surface may be automatically cleaned during transfer between stations, provides foolproof product orientation and product presention, permits variance in screening speed in either direction, allows single or double pass strokes, and in which the nozzle paste tube can be shut off during mask removal.

It is yet a further object of the present invention to provide an improved, fully automatic screening apparatus for screening ceramic green sheets which permits manual adjustment of the machine operating program to correct for mask deterioration, allowing longer mask life and higher product use, and wherein mask separation is effected by slow initial mask separation and subsequent fast fixture return to increase machine processing speed.

It is a further object of the present invention to provide an improved fully automatic multi-path green sheet screening machine in which a new mask may be provided at each screening station for each screening cycle applied sequentially to green sheets moving through said screening stations, and wherein; during the screening via the clean mask, the previously used dirty mask is automatically cleaned thus permitting sequential use of two masks without the necessity of machine shut down to effect mask cleaning.

It is still another object of the invention to provide an improved automatic, multi path, screening machine which includes automatic sequential cleaning of multiple masks employed during the screening process with the masks being cleaned in an area which is virtually isolated from the screening station and wherein, cleaning is effected by spraying solvent on opposite sides of the mask and wherein drying of the mask, subsequent to spraying, is effected by air flow favoring one direction to insure mask pattern cavity clean out.

SUMMARY OF THE INVENTION

The present invention is directed to an automatic screening machine for screening conductive materials through a stencil mask and onto an underlying ceramic green sheet. The machine utilizes an elongated rail structure having disposed in juxtaposition therealong, in order; a first loading station, a first screening station, a common unloading station, a second screening station, and a second loading station. First and second carriage assemblies are mounted on the rail structure for movement along the rail structure. The machine includes means for moving the carriage assemblies, in opposite directions, from the loading stations through the screening stations to the common unloading station for selective positioning at given stations. A green sheet support fixture is located on each carriage assembly. A loading mechanism located at each loading station includes a pick up and placement head which is vertically displaceable relative to a carriage assembly for picking up a green sheet at one position on the carriage assembly and for transferring it to a support fixture at another position on the carriage assembly. Each carriage assembly further comprises alignment means on the support fixture for aligning the green sheet as it is deposited. A screening apparatus is located at each screening station. The screening apparatus includes an assembly for fixing a stencil mask above and in alignment with a carriage assembly when at this screening station. A green sheet positioning mechanism, at the screening station, vertically raises the green sheet support structure relative to the carriage assembly and into a screening position in face abutment contact with the stencil mask. An extrusion mechanism extrudes conductive material through the stencil mask and onto the underlying green sheet supported by the support fixture. Control means operatively connected to the carriage movement means, the loading mechanism, and the screening apparatus effects sequential loading of a green sheet from a stack of such green sheets on said carriage assembly onto the green sheet support fixture and in proper alignment therewith, transport of the green sheet to the screening apparatus, screening of the green sheet and transporting of the screened green sheet to the common unloading station. The control means further effects such operations out of phase for respective carriage assemblies.

Preferably, each carriage assembly comprises a carriage and a trailer which are mechanically coupled together and which move in unison, with the trailer and carriage being separated from each other along the rail structure by a distance of one station position.

At the screening station, an integrated mechanism effects superposition of discrete vertical displacements of the support fixture to raise the support fixture above the carriage to closely position the green sheet in contact with the bottom of the mask prior to screening.

At the unloading station, a horizontally movable, vacuum unloading head is mounted above the rail structure and movable across the rail structure at right angles thereto from a first position, alignable with the green sheet support fixture, to a second position laterally of the rail structure permitting stacking of the screened green sheets for subsequent oven bonding into an integrated package. The unloading head may comprise a pivotable cover which is either manually or automatically rotated, from a horizontal position for receiving a screened green sheet from the fixture, to a generally vertical, open and operator accessable position; whereby, a spacer sheet underlying the green sheet may be removed prior to stacking of the screened green sheet at the unloading station. The unloading head may be shifted laterally, via a rack and pinion drive system, and the cover may be automatically rotated to open position from the horizontal by a rack and pinion drive, with rotation of the cover effected at a given point along the lateral movement path of the unloading head.

The screening apparatus may comprise guide means for slidably guiding a stencil mask along a transverse path across the rail structure and to the rear of the same. Mask clamps mounted to respective guide means permit locking of the mask frame at a first screening position, within the guide means. A mask removal mechanism may be provided for operatively engaging the mask frame to positively shift the mask frame from the first, forward position centered with respect to the carriage support fixture and in alignment with respect to a green sheet for screening, to a second, rearwardly displaced position, within a mask removal station, permitting removal of the stencil mask and transferring of the mask to cleaning chamber means of a cleaning unit remote from the screening area.

Cleaning of the plural stencil masks can be effected alternatively by utilizing dual cleaning chamber mounted rearwardly of the screening station and on opposite sides of the mask removal mechanism. A lateral shuttle assembly may be employed for shifting of included individual mask frame carriers which selectively receive a mask when moved from the first screening position to the second rearward position. This permits each mask to be rotated from a horizontal orientation to a vertical orientation and then shifted laterally into a given cleaning chamber for cleaning. Meanwhile, a clean mask is presented to the mask removal mechanism for movement forwardly from the second or rearward position, to the first, screening position, within the screening station. Each cleaning chamber may be provided with liquid solvent spray nozzle assemblies on each side of the presented mask and forced air manifold duct assemblies constituting rectangular loops may be mounted within the chambers on opposite sides of the mask. The manifold duct assemblies bear air flow slots and nozzles for directing controlled pattern forced air against the surfaces of the mask, subsequent to spraying, for blowing off any retained screening paste and for drying the mask subsequent to paste removal.

BRIEF DESCRIPTION OF THE DRAWINGS

FIG. 3 is a longitudinal, vertical, sectional view of a portion of the screening machine of FIG. 1, at one of the screening stations.

FIG. 5 is a vertical sectional view of a portion of the machine shown in FIG. 3 illustrating the photo cells and flag code of the Z-height adjustment mechanism for the carriage borne green sheet support fixture.

FIG. 7 is a top plan view, partially broken away, of a mask removal mechanism of the screening station of FIG. 6.

FIG. 8 is a front elevational view, partially broken away, of the screening station of FIGS. 6 and 7, illustrating the mask holder clamp assembly and mask removal mechanism.

FIG. 9 is a top plan view of the mask holder clamp assembly and a portion of a mask frame carrier of the screening station and associated mask removal station.

FIG. 10 is a side view, partially in section, of the elements of the screening machine illustrated in FIG. 9.

FIG. 14 is a vertical elevational view of the other dryer manifold assembly of the cleaning chamber of FIG. 12 from the opposite side of the mask.

FIGS. 17A and 17B are timing diagrams for the components of the automatic screening machine of FIGS. 1–15, inclusive.

DESCRIPTION OF THE PREFERRED EMBODIMENT

Figure 1:
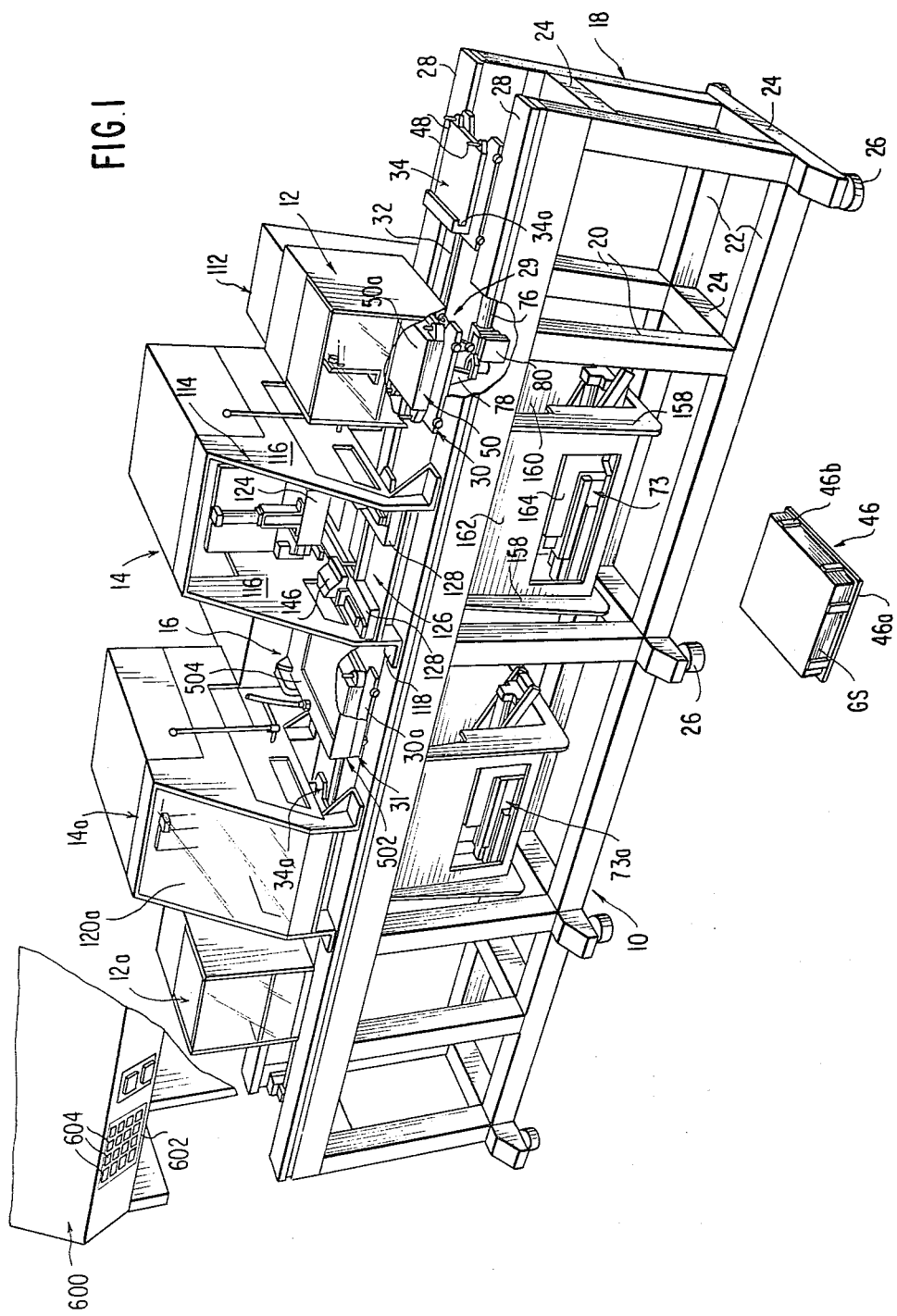
FIG. 1 is a perspective view of a preferred embodiment of the automatic multilayer ceramic screening machine of the present invention and an insertable tray bearing a stack of green sheets and interposed spacer sheets for manual mounting to the trailer of one of the two carriage assemblies.

Referring to the drawings and initially FIG. 1, there is illustrated one embodiment of an automatic multilayer ceramic (MLC) screening machine 10 for automatically screening conductive patterns onto ceramic screen sheets and for automatic cleaning the screening stencil masks, as desired during machine operation.

The screening machine, indicated generally at 10, comprises a plurality of longitudinally separate processing stations with some of the stations duplicated and wherein, screening of individual work pieces, i.e. green ceramic sheets occurs at multiple stations while, the screen printed green ceramic sheets are fed from respective screening stations to a common interposed unloading station, in alternating sequence. In this respect, the screening machine 10 is comprised, from right to left, of a first loading station indicated generally at 12, a first screening station indicated generally at 14, a common unloading station indicated generally at 16, a second screening station indicated generally at 14a and a second loading station indicated generally at 12a. The mechanisms to the left and right of the common unloading station 16 are essentially duplicated, the loading station 12a and the screening station 14a forming a left hand unit for the machine while, the loading station 12 and the screening station 14 forms a right hand duplicate portion of the machine. For simplicity purposes, the machine will be described in detail with respect to loading station 12, screening station 14 (with its accompanying mask cleaning unit) and the common unload station 16. However, it must be kept in mind that, simultaneously with operation of loading station 12 and screening station 14; loading station 12a and screening station 14a are also operating, although, not in synchronism with their corresponding stations 12 and 14, respectively. This is purposely desirable since it is necessary that the unloading station 16 function to unload alternately, the screened ceramic green sheets coming from screening stations 14 and 14a. As will be appreciated hereinafter, the means for moving the green sheets in sequence from the loading station through the screening station to the common unload station cannot move to the unload station at the same time, otherwise there would be a collision and damage to the machine components. Additionally, all functions are achieved automatically. The machine is equipped with a vast number of hydraulic motors and similar drive mechanisms for moving the moveable elements of the machine. Such movement is monitored by a vast number of sensors, which, in turn, feed signals to an automatic control mechanism including a control processor, portions of which are interposed within the machine frame as at various stations such as screening stations 14 and 14a. The various components are under program control such that, automatically duplicate sequence of operations are achieved at the various stations corresponding to the timing diagrams of FIGS. 17A and 17B.

Returning to FIG. 1, the machine 10 may include a front table which has been purposely removed to illustrate the main elements of the various stations. It employs walls and baffling to insure that the various operations occuring at the stations are within a confined, clean air space, this structure mounted to parts of a rigid open frame indicated generally at 18. In that respect, a plurality of vertical supports or posts 20 are mounted to longitudinally extending laterally opposed parallel beams 22. The beams are separated by spreaders 24 to form the rectangular, elongated, open frame 18 resting on the floor by way of feet 26. The transverse spreaders 24 are not provided at the upper ends of the posts 20. Instead, these posts bear longitudinally overlying, laterally spaced, parallel rectangular tracks or base rails 28; which rails 28 run the complete length of the machine. Positioned between, and supported by the rails 28, are first and second carriage assemblies indicated generally at 29 and 31, respectively. Assembly 29 comprises a first carriage indicated generally at 30, FIG. 1 and having physically coupled thereto by way of rod 32 is a first trailer indicated generally at 34. The machine incorporates on the opposite side, second carriage assembly 31 including a duplicate carriage 30a and trailer 34a, oppositely oriented to carriage 30 and trailer 34. Carriage 30a is shown at the unloading station 16 and having connected thereto its trailer 34a in the identical manner to trailer 34 for the right hand carriage 30. The carriages 30 and 30a are generally rectangular in plan configuration. Each is comprised, FIG. 2, of a base or chassis 36 on opposite sides of which depend side plates or projections 38, which are integral with the base 36 and which rotatably mount guide rolls 40, by way of axels or pins 42. Thus, at the top and bottom of the side plates 38 the rolls 40 contact the upper and lower surfaces of the base rails 28, to each side of the carriage. The carriage 30 therefore moves longitudinally within the gap between the laterally spaced rails 28, being maintained in position and guided by the rolls 40 at the top and bottom of the base rail. The rolls 40 are freely rotatable about their axes and provide little friction to the carriages as they move longitudinal on the tracks or base rails 28. These side plates 38 are enlarged vertically, adjacent front and rear ends of the carriage, so as to space the upper and lower rolls 40 to permit the rolls to engage respective faces of the rails 28 upon which they ride.

With connecting rod 32 mechanically coupling the carriage 30 to the the trailer 34, spacing by the rod and the sizing of the carriage and trailer are such that when the carriage 30 is at screening station 14, the trailer 34 is at loading station 12.

For the purpose of permitting the loading of uppermost green sheet GS and its underlying spacer sheet SS, a stack of green sheets and interposed spacer sheets are borne by a tray 46, FIG. 1, which is of generally rectangular form. It is comprised of a base member 46a and a plurality of columns 46b which may be integral with the base, and spaced about the peripheral edge of the tray base 46a. The stack of green sheets interposed by spacer sheets permit the uppermost green sheet indicated at GS, and its underlying spacer sheet SS to be removed from a top of the stack on tray 46 at the loading station 12. In the illustrated embodiment of the invention, the base 46a of the tray is designed such that one lateral edge of the base will slide into a groove or slot 34a of the trailer 34 while, the opposite edge rides against a pair of spring fixtures 48 which act to frictionally lock the tray onto the top of the trailer 34, with the stack of green sheets and interposed spacer sheets facing upwardly. The carriage and trailer are similarly formed, however the carriage has a different function, that is it is required to bear a vertically shiftable green sheet support fixture, indicated generally at 50. Fixture 50 which is of rectangular form and is sized to the green sheet to be presented to the screening station 14 as received from the loading station 12. While the specific makeup of the green sheet support fixture 50 is unimportant, it is required that the fixture be provided selectively, with a source of vacuum or positive air pressure. Upper face 50a of member 50 has areas of porosity such that vacuum pressure and applied positive air pressure may be produced at this surface to control the green sheet and its underlying spacer sheet. The face abutting sheets may be floated onto face 50a. In that respect a vacuum/air supply tube 52, FIG. 2, opens to the interior of the carriage fixture 50 at fitting 54. Since the fixture 50 must be moved vertically with respect to the carriage 30, the carriage 30 carries internally, a sleeve bearing or bushing at 56 and, extending downwardly from the bottom of the fixture head 50, is a fixture post 58 FIG. 3 which is slideably positioned within bushing 56. Post 58 holds at its lower end, a cam follower roller 60 which is mounted via pin 59 for rotation about its axis at right angles to the axis of the fixture post 58. The cam follower roller 60 normally rotates in contact with the upper surface 62a of a cam rail 62 which extends the length of the machine.

However, in addition to extended vertical movement provided to fixture 50 at the screening station such as screening station 14, incremental lift is provided to the fixture 50 at two other positions along its path of movement between stations. Specifically, at the loading station 12, cam rail 62 is provided with a cut out 63 within the upper edge. Positioned within this cut out is a first tee 61 which constitutes a member which may be physically raised a desired increment such as 1/16 of an inch by means of a pneumatic or hydraulic cylinder as at 59 shown connected to tee 61 by way of dotted lines and indicating a mechanical connection between the two, FIG. 3. At the unloading station 16, a second tee 65 is provided within a notched or recessed area 67 of the cam rail 62, this tee 65 being driven by a similar pneumatic or hydraulic motor as at 69 and thus the tee is raised slightly, in this case 3/16 of an inch, thus driving cam follower roller 60 and post 58 (as well as fixture 50 vertically upwardly an incremental amount facilitating unloading at this station. The utilization of the vertically shiftable tee's 61 and 65 at respective loading and unloading stations 12 and 16 will be appreciated by further description with respect to these stations, hereinafter.

Interposed between the fixture post 58 and the fixture 50 is a shock absorbing system indicated generally at 64. Shock absorbing system 64 includes at least one compression spring 64a which normally insures that the periphery of cam follower roller 60 is maintained in contact with the upper surface 62a of the cam rail 62.

When the carriage 30 and fixture 50 move from the loading station 12, FIG. 1, to the screening station 14, the motion of the carriage 30 is terminated with the fixture post 58 in axial alignment with the upper headed end 70a of a cylinder rod 70, projecting upwardly from a fixture lift cylinder indicated generally at 72 and forming a part of the Z-height adjustment and control mechanism indicated generally at 73, for fixture 50.

In order to effect movement of the carriage and its mechanically coupled trailer from one station to another, such movement is achieved by means of a complex movement hydraulic carriage drive cylinder 76, FIG. 1. The cylinder 76 is coupled through a depending plate 78 of carriage 30, via rod coupler 80, to hydraulic cylinder rod 76a such that by a first extension of the cylinder rod 76a, the carriage 30 is shifted along the base rails 28 from a position in alignment with the loading station to a position aligned with the screening station 14. The stroke of cylinder 76 is essentially twice the stroke needed to shift the carriage 30 from station 12 to station 14 and the cylinder also moves the carriage the length of its full stroke, that is to the unload station 16. Under a program sequence, the carriage 30 moves in sequence, from right to left, FIG. 1, that is from station 12 to station 14, being stopped at this screening station until screen printing of the green sheet takes place, then carriage 30 moves to common unload station 16, upon full stroke of hydraulic cylinder 70. As will be appreciated hereinafter, the carriage 30, when moving from the unloading station 16 back to the loading station 10, has no need to make an intermediate stop at screening station 14, but moves through that station in a full return stroke of the cylinder rod 76a, from the unloading station 16 to loading station 10, as illustrated in FIG. 1.

Being mechanically directly connected to the carriage, the trailer 34 moves such that when the carriage 30 is at the screening station 14, the trailer is aligned with the components of the loading station 12. It is during this portion of the cyclic movement of the carriage and trailer that the top most green sheet G.S. and its underlying spacer sheet S.S. are physically removed from the stack. The function of the loading station 12 is to remove the uppermost green sheet GS and its underlying spacer sheet SS from the top of the stack on tray 46 which is borne by trailer 34 and which underlies the pickup and placement head indicating generally at 74.

Figure 2:
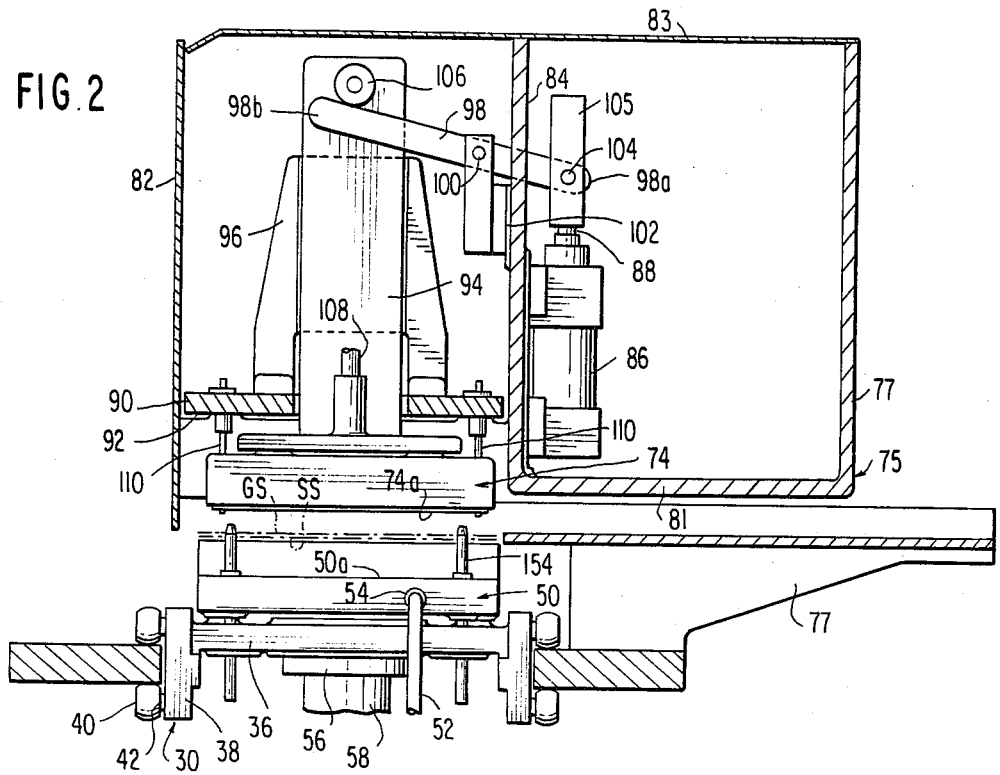
FIG. 2 is a vertical section through one of the loading stations of the screening machine of FIG. 1.

Referring again to FIG. 2, the loading station 12 comprises certain components which are mounted within a loading station housing 75, these elements all being supported by the frame 18. In this respect, the frame 18 includes a loading station support base 77 upon which is fixedly mounted, housing 75. Housing 75 is formed as illustrated in FIG. 2, of a vertical rear wall 79 (when viewed from the front of machine) a bottom wall 81, an overlying cover 83 and a raiseable door or front wall 82. An intermediate vertical wall 84 acts to support a vertically oriented hydraulic cylinder 86 whose cylinder rod 88 projects vertically upwardly from the upper end of that hydraulic cylinder. On the opposite side of the intermediate wall 84 is provided a transverse mounting or support plate 90 which is fixed to housing 75 by way of brackets 92. Through the center thereof, projects a post 94, its lower end, being fixed directly to the pickup and placement head 74. Post 94 is guided by a suitable vertical guide assembly 96 and is raised and lowered by means of a hydraulic cylinder 86. This is achieved by the utilization of lift lever 98, which is pivoted at 100, intermediate of its ends, on a support bracket 102. One end 98a of lever 98 is pin coupled to the piston rod 88 by means of a pin 104 and clevis 105, while, the opposite end 98b of the lift lever underlies a roller 106 which projects from the face of post 94. By extending the cylinder rod 88 of hydraulic cylinder 86, post 94 is permitted to move downwardly, lowering the pickup and placement head 74 with respect to the underlying carriage 30 or trailer 34 depending upon whether the head is functioning to extract the uppermost green sheet and its underlying spacer sheet from the stack of such sheets on tray 46 or, functioning to accurately position such selected single green sheet and its underlying spacer sheet onto carriage 30 for transport sequentially to the screening station 14, for screen printing, and to unloading station 16, for unloading. In similar fashion to fixture 50 borne by carriage 30, the pickup and placement head 74 is provided with a supply of air, under vacuum pressure or positive pressure, selectively, through a supply tube 108 connected to the top of head 74. The pickup and placement head for the green sheet and spacer is of the type set forth in U.S. Pat. No. 4,185,814 referred to previously. It functions, in part, in the manner set forth in U.S. Pat. No. 4,186,918 also referred to previously. While reference may be had to these two related disclosures for more detailed information with respect to their makeup and function, the vacuum pickup and placement head is of generally rectangular configuration. It is provided with a sheet contacting lip with vacuum slots, formed within the periphery thereof, which function to hold the sheets peripherally by vacuum pressure. The center of the sheet contacting face 74a of head 74 is recessed such that with the green sheet and the spacer sheet underlying face 74a act as a diaphram and a central vacuum chamber is formed between the sheet and the head 74. A series of check valves (not shown) are provided for controlling the application of vacuum and positive air pressure for picking the sheet up, retaining it, and facilitating the transfer and accurate placement thereof from the trailer 34 to the carriage borne fixture 50.

Further, when acting in conjunction with the teachings of U.S. Pat. No. 4,186,918, the green sheet and spacer sheet are suspended between opposed pressure zones while alignment pins move through the sheet locator or alignment holes to assure accurate positioning of the green sheet on fixture 50 prior to presentation to screening station 14. All of these teachniques occur at the automatic loading station 12 (and its counterpart 12a).

As seen in FIG. 2, a plurality of sensor probes or pins 110 may be employed, the pins being axially displacable and having ends projected through the pickup and placement head 74, as for instance at diagonally opposed corners, for contact with given sheets or for passage through holes borne by the sheets. The probe or pins 110 can also perform a positive stripping function for stripping the green sheet and/or spacer sheet by forced removal from the contacting face 74a of the head 74.

To the left of the loading station 12, FIG. 1 is one of the screening stations, station 14.

Figure 6:
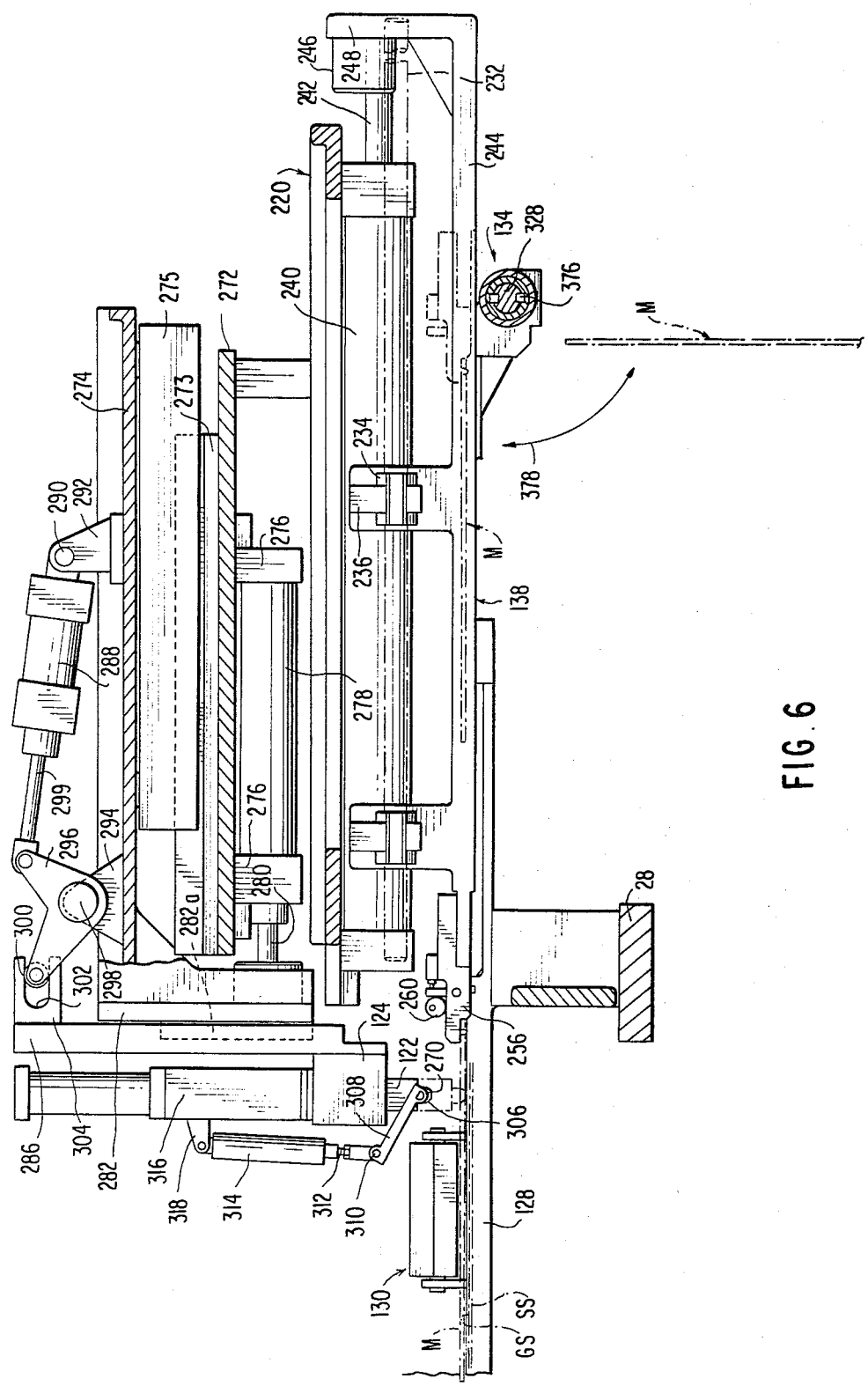
FIG. 6 is a transverse, vertical, sectional view of a portion of one of the screening stations of the screening machine of FIG. 1.

The screening station 14, for an example, has integrated therewith an automatic mask cleaner unit which unit, indicated generally at 112, is located behind the screening station 14, at the back of the machine, and extends laterally to opposite sides of a mask removal station integrated therewith, such that portions of the cleaning unit are behind the loading station 12 and the unloading station 16. The screening station 14 is constituted by a housing or screener console indicated generally at 114 including spaced vertical side walls 116 which rise from and are mounted to the tracks or base rails 28 by way of feet 118. The screener console 114 includes a rearwardly and upwardly inclined, preferably transparent, front wall or cover (removed for unit 14, FIG. 1, but being shown in place for screener station 14a, at 120a). Housed internally within the screener console are various components (best seen in FIG. 6) including a paste tube 122 mounted to a horizontally shiftable paste tube carrier 124. Tube 122 moves forwardly and rearwardly within the screener console to sweep across a screening area, indicated generally at 126, FIG. 1. Area 126 is defined by laterally spaced fixed guide or support bars 128 which bear as principal components thereon mask clamps 146 to each side of the screener console. Members 128 are fixedly mounted to the side walls 116 of the screener console. These members form principal components of a mask holder clamp assembly indicated generally at 130, the function of which is to lock a stencil mask, such as mask M, by its integral frame 132 at proper position within each screening station. Each mask, when dirty, is selectively replaced by a identical or otherwise clean mask, preferably after each screening operation, such that the prior, dirty mask may be cleaned within the automatic mask cleaner unit 112 integrated with the screener console 114 and the equipment at the screening station 14. The mask holder clamp assembly 130 and one mask frame carrier indicated generally at 134, FIG. 6, is illustrated in greater detail in FIGS. 9 and 10. They occupy the portion of the screener console 114 just above the base rails 28 upon which the carriage and fixture are borne. The laterally spaced guide bars 128, FIG. 8, are wider than the lateral extent of the mask frame 132 over which the mask frame traverses when moving to and from the automatic mask cleaner unit 112. The support bars 128 include to the rear, thereof integral elongated, narrow raised portions 128a defining shoulders 133 on each side of the mask holder clamp assembly 130, which are spaced apart just slightly greater then the lateral width of the mask frame 132. Slots 135 within the bars 128 bear rollers 136 which are mounted for rotation about their axes. The tops of the rollers 136 are slightly raised above the upper surface of bars 128, inwardly of shoulders 133, FIG. 9. The mask frame 132 of mask M is moved from the full line position shown, to the rear of the screener console, to its full forward, dotted line position spaning the gap between opposed shoulders 133 of members 128. The forward ends of the shoulders 133 of members 128 are flared so that, as will be appreciated hereinafter, the individual masks may be replaced as desired by simple frontal insertion of their mask frames to a position where, they are engaged by elements of the mask removal mechanism indicated generally at 138, FIG. 9, and shown in detail in FIG. 7.

During the horizontal movement of the mask frame 132 it is guided by suitable strip like guide members 140 and 142 fixedly mounted to opposite sides of the raised portions 128a of bars 128. Projecting upwardly from bars 128 and raised portions 128a, at opposite sides of the mask holder clamp assembly 130, are bracket members 144 which function to pivotally support mask clamps 146 by way of axels or pivot pins 148. Pivoting of the clamps 146 is achieved by means of pneumatic or hydraulic motors, or electrically by solenoids, as indicated at 150. The clamps 146 are preferably spring biased towards open position and clamping occurs by depression of elongated portions or feet 146a of the clamps, with feet 146a contacting opposed edges of the mask frame 132 outside of the pattern area of the mask M. Bars 128 are further provided with longitudinally spaced and aligned holes 152 on opposite sides thereof which function to receive positioning pins 154 which project upwardly from the upper face 50a of the fixture 50 and are employed in the floating of each green sheet and its underlying spacer sheet onto fixture 50. Fixture 50 presents a green sheet to an overlying mask, at the mask dotted line position, FIG. 9.

In FIG. 10, the fixture 50 is aligned with the mask clamp assembly 130 for its upward travel to the extent where a green sheet is positioned immediately beneath the mask M, in face-to-face contact therewith.

Prior to further describing the elements within the screener console, a more detailed description of carriage 30 and its fixture 50 and its mode of transport from the loading station where it has just received a green sheet and underlying spacer sheet to the screening station, is in order. In that respect, with reference to FIG. 1, it is noted that, at each screening station 14 and 14a, there is provided beneath the base rails 28 and mounted to frame 18, a Z-height adjustment mechanism; one at 73, for screening station 14, and another at 73a for screening station 14a. With respect to screening station 14, and by further reference to FIGS. 3–5 inclusive, it may be seen, that the Z-height adjustment mechanism 73 comprises longitudinal spaced, vertical walls or support plates 158 of generally U-shaped configuration and having a central open or slotted area 160. This yoke or support assembly further comprises spaced vertical walls 162, one of which bears a window at 164 providing access to the mechanism components. A base 166, FIG. 3, supports horizontally at one end, a Z-height hydraulic drive cylinder 168 from one end of which projects a cylinder rod 170 which is operably coupled to a longitudinally shiftable slide or cam member 172. Slide 172 is constituted by an elongated cam slot 174 including a relatively flat, slow rise portion 174a and a steeper portion 174b, as a continuation thereof. Pivotably mounted to the base 166 is a cam follower pivot arm 176, via a horizontal pivot pin 178, such that the arm 176 may rotate in a slight arc as indicated by doubled headed arrow 180, FIG. 3. The cam follower arm 176 bears at the end 176c remote from the pivot axis as defined by pin 178, a cam follower roller 182. Cam follower roller 182 is pivotably mounted via axel 184 between opposed legs 176a and within an elongated slot 176b, which slot runs the length of the outboard end portion 176c of the cam follower arm 176. The cam follower roller 182 rotates about its axis and has a diameter slightly less than the width of the cam slot 174. As may be appreciated, extension and retraction of rod 170 of the hydraulic cylinder 168 causes the cam member or slide 172 to follow that movement whereupon, the cam follower roller 182 is raised and lowered within the inclined portions 174a, 174b of the cam slot 174. Fixedly mounted to the top of the cam follower arm 176 is initial height control hydraulic cylinder 72, whose cylinder rod 70 is projected and retracted to an extent defined by the cylinder piston stroke (of one and one half inches, for example). The total lift is controlled by the automated program of the screening machine and the extent of horizontal movement of slide or cam member 172 and the vertical motion imparted to the hydraulic cylinder 72 and to the cam follower arm 176, as defined by cam slot 174.

This movement is directly imparted to raisable fixture 50 carried by the carriage 30 when fixture post 58 has it center line in longitudinal alignment with the axis of cylinder rod 70, that is, when the carriage 30 and its fixture 50 overlies the axis of hydraulic cylinder 72.

Figure 4:
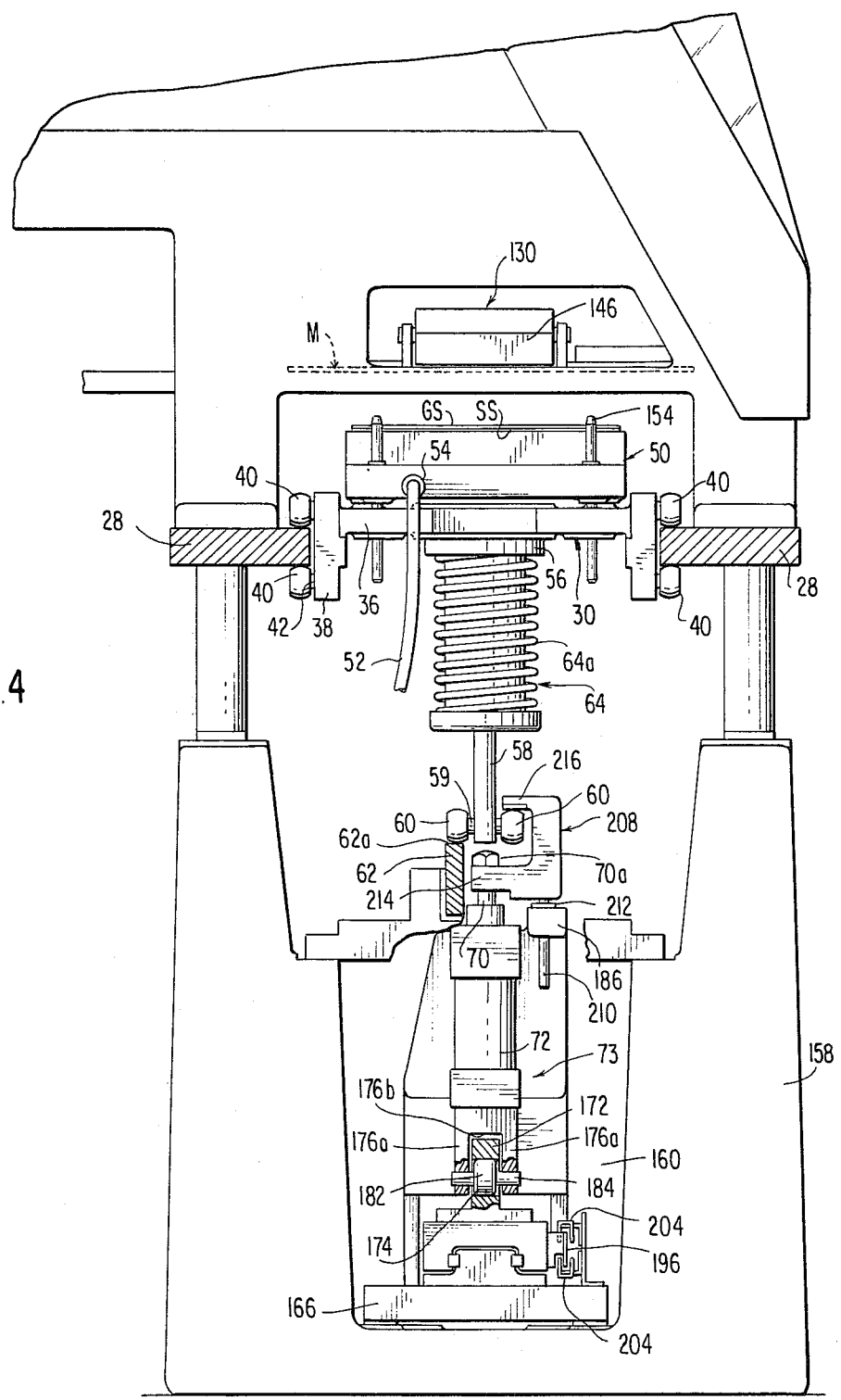
FIG. 4 is a vertical sectional view through the screening station of FIG. 3.

Subsequent to the carriage 30 and the fixture 50 being properly positioned in vertical alignment with hydraulic cylinder 72, initially a control signal is applied to hydraulic cylinder 72 to cause the cylinder rod 70 to be extended to an extent determined by its piston displacement such that the fixture 50 is lifted toward the mask holder clamp assembly 130. The mask M is already at that location and in a position of alignment with the fixture 50 as defined by positioning pins 154, FIG. 4. The Z-height control mechanism 73 involves the controlled extent of movement of hydraulic cylinder rod 170 as indicated by arrow 171, FIG. 3, that is the extent in which the cam follower roller 182 rolls up the steep and shallow rise portions 174b and 174a, respectively of cam slot 174. This is achieved by use of two or more photocell sensor assemblies, indicated generally at 190, 192, FIG. 5 which are vertically positioned to the side of a code flag or code strip member 196. The code flag 196 is fixed to the horizontal moveable cam member or slide 172, and is moveable therewith. The code flag is composed of a 4 bit code including three stepped code slots at 198, 200 and 202. The slots 198 and 202 are at the same vertical height and in line with each other and are of the same configuration, while slot 200 is positioned above both code slots 198 and 202 completely overlies slot 202 and partially overlies slot 198. Each of the code slots includes integral portions of two different heights. The photocell assemblies 190, and 192 which are bracket mounted to the fixed base member 166 bear suitably opposed photocells and electrical light sources at four different heights corresponding to the four bit portions of the code flag slots. As indicated in FIG. 4, the code flag strip 196 is mounted by bracket to the cam member 172 so as to move therewith. Each photocell sensor assembly includes two U-shaped members as at 204, FIG. 4, for permitting respective photocells and lights to be on opposite sides of the code flag strip 196 bearing the slots. When the moving slots open to an aligned, opposed photocell and light source, a light projecting from the light source to the photocell cause an electrical signal to be delivered to a control processor (not shown), to indicate the position in movement of the cam 172 and thus the corresponding vertical height change for the fixture 50 and its supported green sheet as a result of the cam follower roller 182 following the contour of the inclined cam slot portions 174a and 174b.

The fixture 50 borne by the carriage 30 includes appropriate means for insuring that the follower cam roller 68 moves downwardly to contact edge 62a of the cam rail 62 upon retraction of the hydraulic cylinder rod 70. The present invention employs a C-shaped pull block 208 which is mounted for vertical movement on a transverse support bar 186 by way of a rod 210 which projects from the base of the pull block 208 and which is slidably received within bar 186 by means of bushing 212. Further, the C-shaped block has a lower arm 214 through which projects the cylinder rod 70 with an enlarged, headed end 70a bearing on this arm during retraction of the cylinder rod 70. An upper arm 216 of the pull block overlies one cam follower roller 60 to the side opposite an identical roller 60 bearing on cam rail 62. During retraction of the cylinder rod 70, the fixture 50 is forceably pulled downward to the extent of such retraction by block 208. Additionally, since the cylinder is fixedly mounted to end 176c of the cam follower arm 176, during retraction of the hydraulic drive cylinder rod 170, the cam follower roller 182 forces the fixture to move down even farther over that achieved by operation of hydraulic cylinder 72. During raising of the fixture, the hydraulic cylinder 72 is the first to operate while, during lowering of the same fixture, it is the last to operate.

As may be appreciated, the elongated code flag slots 198, 200 and 202 constitute a digitally coded light mask which is fixed to and moves with the slide cam member 172. The digitally coded four track mask thus has different shaped cut-out areas which provide a 4-digit code defining 15 multiple bit positions or steps in the horizontal direction of movement of the slide assembly 173. By using the photocell sensor assemblies at different positions there is achieved a mechanism in which, the initial separation of the green sheet from the overlying mask is achieved at a relatively slow speed via slight rise cam slot portion 174a while, subsequent to an initial incremental separation of the green sheet by vertical drop of fixture 50 from the stencil mask M, the remainder of the vertically downward movement of the green sheet support fixture 50 is achieved at a much more rapid speed. This facilitates the speed at which carriage 30 and the fixture 50 borne thereby moves from the screening station 14 to the unload station 16.

Referring again to FIGS. 6-10 inclusive not only is the screening machine of the present invention automated to the extent that the green sheet to be screen printed under control of the stencil mask M is moved into the screening station 14 for screening and then moved to the unloading station 16, but automatically the stencil masks are periodically cleaned, in some cases, after each and every screening operation. As a matter of fact, a principle aspect of the present invention is the mechanism for alternately replacing a dirty stencil mask with a new, clean mask (even though it may bear the identical pattern) to the mask holder clamp assembly 130. This is achieved by use of the mask removal mechanism 138 previously referred to and as shown in detail in FIGS. 7 and 8, in conjunction with the mask frame carriers 134 and 134', FIGS. 9, 10 11 and 12. Frame 18 which supports screen console 114 and to which is also connected the automatic mask cleaner unit 112, bears within the screen console, and to the rear thereof, a fixed open frame assembly indicated generally at 220 within mask removal station or mask presentation area 324 for the mask removal mechanism 138, FIGS. 7 and 8. The rectangular frame assembly 220 includes laterally opposed, vertical bars 222 across which spans transverse coupling beams 224 and 226, at the front and rear of the assembly 220 (viewed from the front of the machine 10). Brackets 228 on the sides of this frame assembly integral with vertical bars 222 connect to the side walls 116 of the screening console 114. Within the open frame assembly 220, there are fixedly provided a pair of rods 232, via bases 233 upon which, are mounted rod ball bushings 234 borne by suitable pillow blocks 236. The pillow blocks are fixed to flanged base members 238, FIG. 8. Rods 232 extend well beyond the end of a hydraulic cylinder 240 which horizontally shifts the mask frame 132 on the rods via a cylinder rod 242, which is shown projecting from the rear of the cylinder, FIG. 7. The cylinder 240 is fixedly mounted to the frame assembly transverse bars 224, 226. The projecting end of cylinder rod 242 is fixedly mounted to an underlying drive plate or bar 244 by way of a coupling 246 which is coupled directly to a vertical end wall 248 integral with the drive plate 244. The drive plate 244 is U-shaped in cross section, FIG. 8 and has fixed to opposite sides thereof, the pillow blocks 236 bearing the rod ball bushings 234, via the base members 238. The front view of this assembly, FIG. 8, illustrates the nature in which the drive plate 244 connects to the mask frame 132. In that respect, plate 244 supports an L-shaped, pivotable block 252 bearing a depending mask holder pin 250. Pin 250 projects downward from the pivotably mounted block 252, FIG. 6 Block 252 is pivotable about a horizontal axis defined by axel 254 supported on arms 256. Normally the block 252 and pin 250 are in the position shown in FIG. 6, at either a first, forward or second, rearward position determined by extent of the stroke provided by hydraulic cylinder 240 through rod 242 and coupling 246 to the drive plate 244. However, by operation of a manual release mechanism indicated generally at 251, the block 252 can be cammed to a position where pin 250 rises out of a corresponding hole within a trailing edge 132a of mask frame 132. By lifting of the front cover of the screener console, a mask, such as mask M may be removed and a new mask may be substituted therefore. To achieve this release, the mechanism 251 includes a rod or shaft 258 which rotatably projects through opposed walls 116 of the console and bears a cam 260 intermediate of its ends. The cam 260 has its periphery abutting block 252, block 252 forming a cam follower for cam 260. Shaft 254 is rotatably mounted to the arms 256 on opposite sides of the pin 250. A crank arm 266 bearing knob 268, is fixed to shaft 258 exterior of the screener console 114. By rotating the crank arm 266, the L-shaped mask holder pin support block 262 is rotated against a spring biasing force or the like to raise the mask holder pin 250 and permit removal of one mask and selective insertion of a new mask.

While the mask frame 132 of mask M is in its normal dotted line or forward position FIG. 7, the side edges of the mask frame 132 underlie the pivotal mask clamps 146. By the supply of positive air pressure to air cylinders 150, the clamps 146 to each side of the apparatus, FIG. 8, may be pivoted to the extent that the feet 146b of the clamps press the mask frame 132 edges, exterior of the mask M pattern, against bars 128. Also, as indicated previously, it is at this time that the fixture 50, supported by carriage 30 is raised to the extent that a green sheet, such as GS carried on the upper surface of the same, is moved into the contact with the bottom face of mask M. The positioning pins 154 are received within holes 152 defined by bushings 153 borne by the L-shaped bars 128, which function to support the mask frame and to guide the same during movement to and from the automatic mask cleaner unit 112.

With the mask M in place and with a green sheet GS positioned immediately beneath the mask and in contact therewith, screening of the green sheet may be accomplished by forced extrusion of paste from paste tube 122. Referring again to FIG. 6, it is seen that screening is effected by moving the paste tube 122 from front to rear or vice versa while forcing the paste to be extruded from a paste tube nozzle 270, which projects downwardly from the lower end of paste tube 122. In addition to the open frame assembly 220 for the mask removal mechanism 130 fixed to the screener console, there is provided an additional transverse fixed support member above the open frame assembly 220. Specifically, a screener main drive cylinder support plate 272 bears longitudinally spaced brackets 276 which fixedly mount the screener drive cylinder 278, cylinder 278 having a cylinder rod 280 projecting therefrom, towards the front of the machine. Plate 272 includes a horizontal guide or track 273, bearing slide 275. A transverse plate 274 integral with slide 275, terminates of its forward end, in a vertical paste tube assembly mounting plate 282. Plate 282 is coupled to cylinder rod 280. A vertically slideable paste tube mounting plate 286, which bears a suitable keyway, slidably mounts to a key portion 282a of paste tube assembly mounting plate 282. The vertical mounting plate 286 bears at its lower end, via resevoir 124, paste tube 122. The paste tube 122 is shifted vertically from its raised, full line position, FIG. 6, to its lowered, dotted line position by operation of a nozzle height adjustment cylinder 288. Cylinder 288 has one end pivotally mounted by pin 290 to a bracket 292 fixed to the top of slide transverse plate 274. Forward of bracket 292 is a second bracket 294, upon which pivots a crank 296, by way of a transverse pivot pin 298. One arm of the crank is pin connected to a cylinder rod 299 of the nozzle height adjustment cylinder 288 while a second arm bears a roller 300 which, is received within a slot 302 of a block 304 mounted to the upper end of plate 286.

As may be appreciated, by the extension of cylinder rod 298 the crank 296 is rotated counter clockwise, FIG. 6, which lowers slide 286 and paste tube 122, forcing it to move downwardly until the paste tube nozzle 270 contacts the upper surface of mask M, indicated in dotted lines as underlying the lower end of the paste tube nozzle and being held in that position by laterally opposed mask clamps 146. As mentioned previously, extension of the cylinder rod 280 of the screener main drive cylinder 278 results in a sweep of the paste tube nozzle 270 across the mask M, forcing the paste through the mask pattern holes and the filling of "via holes" within the green sheet GS underlying the mask during cyclic operation of the machine. The application of the flow of the paste and its cut off is effected by way of a pivotable shutter 306 which underlies the paste tube nozzle. The shutter 306 has an elongated slot corresponding to a slot or opening within the nozzle itself. The shutter 306 is pivotably mounted to the nozzle itself. An arm 308 is fixedly mounted at one end to the paste tube nozzle shutter and, pivotably mounted, at its opposite end, by way of pin 310, to the projecting end of a cylinder rod 312 of a shutter operating cylinder 314. Cylinder 314 is supported by paste extrusion hydraulic cylinder assembly 316 via bracket 318 mounted to the exterior of that assembly. Suitable hydraulic fluid under pressure is supplied to the shutter operating cylinder 314 for controlling the closing off of the paste tube nozzle or opening of the same while, during the shutter open position, hydraulic fluid supplied to hydraulic fluid assembly 316 functions to force paste under pressure to be extruded from the paste tube nozzle 270 and forced through the mask openings onto a green sheet, such as green sheet GS, FIG. 6, and to penetrate the interior of the "via holes" within such green sheet. All of this is achieved by a programmed control system for moving the moveable elements of the system under a sequence, which will be appreciated by further reference to FIGS. 16A-F and FIGS. 17A and 17B, as described in detail, hereinafter.

Having once accomplished, automatically, the screen printing of a green sheet or like flimsy sheet of flexible material at a screening station, under program control, the stencil mask M is retracted into the mask removal station 324 to the rear of the screening console. It is further transported laterally to one of two laterally spaced mask cleaning chambers while, a previously cleaned mask is presented to the mask holder clamping assembly 130 for screen printing of a succeeding green sheet, as presented by carriage fixture 50. In effecting the front to rear movement (relative to the front of the machine 10) FIG. 1, the mask frame 132 is pulled horizontally rearward over a path defined by the L-shaped mask holder clamp assembly guide bars 128 and guides 140 and 142, FIG. 9 to the full line position of that figure, by the depending mask holder pin 250 positioned within a hole within trailing edge 132a of the mask frame 132.

Figure 11:
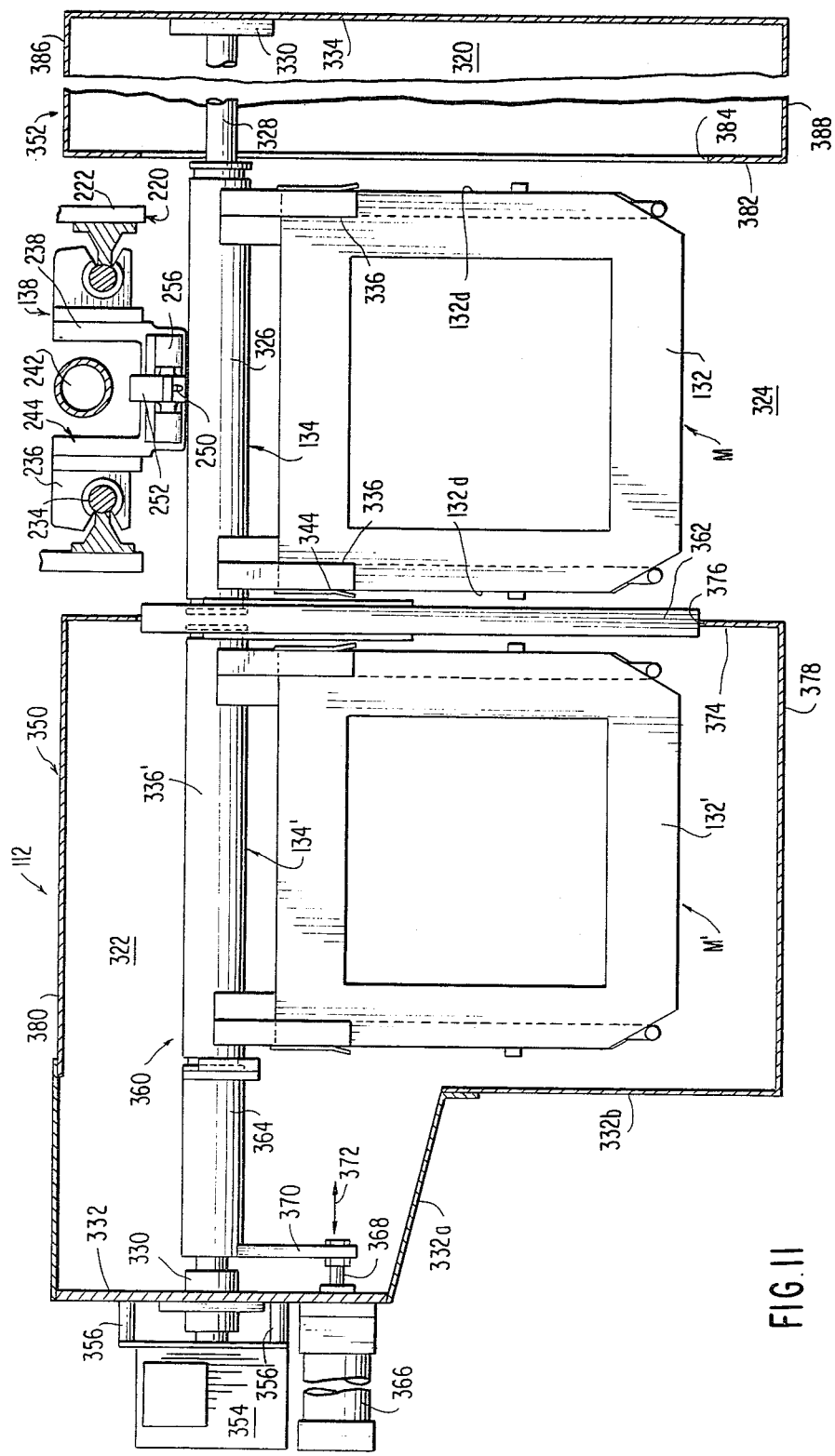
FIG. 11 is a vertical, sectional view of the main components of the mask cleaning unit for one of the screening stations of the screening machine of FIG. 1.

At the rear of the machine, and within the automatic mask cleaner unit 112, there is provided by way of suitable cabinet or housing structure, for each half of the machine, a pair of laterally separated mask cleaning chambers, 320 and 322, FIG. 11. Intermediate of the cleaning chambers 320 and 322 is a non-chambered mask presentation, or mask removal station or area 324, which is open at its upper end and through which projects elements of the mask removal mechanism 130. Specifically, in FIG. 11, which is a vertical sectional view, from the front of the machine looking rearwardly, the mask holder pin 250 borne by the L-shape block 252 terminates in its rearward movement by being slightly in front of a lateral shuttle assembly sleeve 326. Sleeve 326 is mounted on a drive shaft 328 which is axially fixed, but which shaft is mounted for rotation about a pivot axis defined by bushings 330 mounted to lateral side wall 332 of cleaning chamber 322, and 334 of cleaning chamber 320. Pillow blocks 236 permit, the plate 244 bearing the mask holder pin 250 to be moved rearwardly on rods 234 by means of the ball bushings 234 by extension of the cylinder rod 242. For each of the automatic mask cleaning units there are provided duplicate mask frame carriers, as at 134, 134'.

As clearly seen in FIGS. 9 and 10, the outer sleeve 326 fixedly mounts by welding or the like, laterally opposed frame guide arms 336. Each arm includes a radial arm portion 336a, terminating in an angulated mask bearing arm portion 336b. Within slots 338, the sides of the trailing end 132a of the mask frame 132 project. The outboard ends of the mask bearing arm portions 336b extend beyond the ends of L-shaped guide or support bars 128 of the mask holder clamp assembly 130, when rotated parallel therewith. Overlying guides 142 guide the mask frame 132 as it is being pulled rearwardly into the mask cleaning unit by mask removal mechanism 130. Mounted to the arms 336 and projecting from slots 338, are a pair of thin leaf springs 340 which terminate beyond the end of arms 336. On the upper face of each leaf spring, at their outboard ends, is a button or pin 342, which buttons ride on the bottom of the mask frame 132, on respective sides thereof, as the mask frame 132 is pulled outwardly in contact with upper and guides 142 of the mask holder clamp assembly. The leaf springs are normally straight, that is unflexed, except during transfer of the mask from the dotted line position, FIG. 9 to the full line position. Particularly, the leading end 132b of the mask frame is provided with bevelled edges as at 132c, on opposite sides thereof, such that, when the mask removal mechanism 138 pulls the mask frame trailing end 132a into slots 338 of arms 336, the buttons 342 move upwardly, FIG. 9 to abut bevelled edges 132c of the mask frame. The purpose of this is to insure that when the mask frame carrier 134 is rotated such that the arms 336 move from a horizontal position to a vertical position, in the sequence FIG. 9 and 10 to 11, the mask frame 132 is retained in place on the mask frame carrier for subsequent lateral movement into left or right hand cleaning chambers 320, 322.

Further, each leaf spring 340 bears a lateral projecting pin 341 which contacts the bottom edge of adjacent bar 128 to automatically remove button 34 from clamped edge 132c of the mask frame when the mask frame moves toward horizontal position. This frees the mask for transport to the screener console.

At the sides of the arms 336 there are provided additional leaf springs 344 which bear on opposite lateral edges 132d of the mask frame 132 to frictionally restrain the mask frame to the mask frame carrier 134. As may be appreciated, mask holder pin 250 moves out of a corresponding small hole provided within the mask frame trailing end 132a with the mask frame simply rotating away from the mask removal mechanism and with the mask thereby shifting from a horizontal orientation to a vertical orientation by privoting of sleeve 326 about its axis.

Further, during the mask return movement to the horizontal positions shows in FIGS. 9 and 10, the bearing arm portions, which include laterally projecting tabs or stops 346, are stopped at a position permitting transfer of the mask frame. The tabs 346 impinge on the bottom of the mask holder clamp assembly guide bars 128, at their ends, thus acting as positive stops for preventing overrotation of the mask frame carrier 134 and the arms 336, which detachably bear the mask. This functions aligns the mask with the mask removal mechanism 138 and with the mask holder pin 250 for projection within mask frame pin receiving hole of the mask frame trailing edge 132a.

The automatic mask cleaner unit indicated generally at 112 involves a number of cabinets mounted to the rear of frame 18 behind the screening station 14 and laterally to both sides thereof. In this respect the drive shaft 328, FIG. 11, extends through left hand cabinet indicated generally at 350 and through the mask presentation or mask removal area 324 and right hand cabinet 352. The shaft is mounted, as previously indicated, by bushings 330 for rotation about its axis. Such rotation is effected by a conventional hydraulic rotary motor 354, mounted to side wall 332 of cabinet 350 by suitable mounting posts 356. Shaft 328 connects directly to the hydraulic motor 354. It may be rotated through 90 degrees, in alternate directions, by suitable supply of hydraulic fluid under pressure thereto. The rotary effort is selectively directed to a given sleeve, such sleeve 326 of the mask frame carrier 134, by a spline or key connection. The two mask frame carriers are mounted side by side in a lateral shuttle assembly indicated generally at 360 and comprised of the two sleeves 326, 326' an interposed door 362 and a further sleeve 364 at the end of cleaning chamber 322, immediately adjacent wall 332. While sleeves 326 and 326' are connected together to move axially in unison with door 362, along with sleeve 364, they are rotatably independent. A shuttle drive hydraulic cylinder 366 is fixedly mounted to vertical wall 332 adjacent the rotary drive hydraulic motor 354. The shuttle drive hydraulic cylinder 366 bears a shuttle drive cylinder rod 368 which has fixedly mounted thereto, at its outboard end, a drive arm 370 which connects radially to sleeve 364. The rod 368 is shown in the retracted position, FIG. 11, however, when that rod is extended, the lateral shuttle assembly 360 shifts to the right, FIG. 11, so as to place mask M within cleaning chamber 320 and mask M' (which has just been cleaned), within the presentation area 324 for rotation 90° from the vertical position shown in FIG. 11 to the horizontal position shown in FIGS. 9 and 10. At that time, mask removal mechanism 138 forcibly drives the the clean mask M' to screening area 126, underlying mask clamps 146 and at a forward position overlying a green sheet supplied by the carriage born fixture 50. The lateral shuttle assembly 360 is shifted sequentially to the right and left by operation of the shuttle drive hydraulic cylinder as indicated by double-headed arrow 372, FIG. 11, to alternately clean masks M and M'.

In order to effect selective rotation only of the mask frame carrier 134 or corresponding mask frame carrier 134', when within the presentation area 324, and to prevent the rotation of either mask frame carrier when in a cleaning chamber, the present invention utilizes a key or spline connection within the mask presentation area 324. As illustrated in FIG. 10, the outer sleeve 326 bears an integral sleeve 374 which is grooved as at 374a to form keyways at diametrically opposite positions and which selectively receive radial keys 376, FIG. 6, borne by the drive shaft 328 of this member only in the presentation area 324. Since shaft 328 is axially fixed but is rotatably driven by way of the hydraulic rotary motor 354, its function within the presentation area is to rotate sleeve 326 (or sleeve 326') and the mask frame borne thereby under a suitable program after the mask frame has been initially driven onto the mask frame carrier 134 by retraction of that mask frame, FIG. 9. It moves a mask from a horizontal position to a vertical, depending position, whereupon lateral shuttle assembly 360 effects lateral shifting of the shuttle and both masks to the right or left to effect cleaning of the unclean mask and presentation of the clean mask to the mask removal mechanism.

Assuming that the mask M has moved from the full line position of FIG. 6 to the full line position of FIG. 11, by driving hydraulic rotary motor 354 appropriately to effect counterclockwise movement of the mask frame carrier 134, FIG. 6, as indicated by the arrow 378, the dirty mask M upon being rotated 90° is in a position to be shifted laterally from the presentation area 324 to the right hand cleaning chamber 320, not occupied by a mask frame carrier. This will cause simultaneously, mask M' to move into presentation area 324 where, during cleaning of mask M, mask M' may be selectively rotated, by operating hydraulic rotary motor 354 in the opposite direction, from a vertical position to a horizontal position and thus counterclockwise about the axis of shaft 326. This movement is stopped automatically by stops 346 with the mask frame 132' positioned identically to that of mask frame 132, FIG. 9 whereupon, the second mask M' may be moved into proper screening position with its mask frame 132' clamped in the dotted line position, FIG. 9, corresponding to the dotted line position for mask M of that figure.

The left- and right-hand cabinets 350 and 352 may be formed of sheet metal, such as stainless steel. They are laterally separated from each other by way of presentation area or mask removal station 324. The cabinet 352 is of rectangular form, while the left-hand cabinet 350 includes, a projecting portion bearing the shuttle drive mechanism and the means for rotating the drive shaft 328 to effect pivoting of the mask frame carriers 134 and 134' when in the presentation area. As viewed from the front of the machine 10, cabinet 350 includes in addition to lateral sidewall 332, an opposed lateral sidewall 374 which has an irregular rectangular shaped opening or doorway 376 through which extends the drive shaft 328 as part of the lateral shuttle assembly 360, made up principally of the two mask frame carriers 134 and 134'. Door 362 matches the configuration of the doorway 376 and is mounted intermediate of the mask frame carriers and is laterally shiftable therewith by shuttle drive hydraulic cylinder 366. Lateral wall 332 includes an inclined portion 332a and terminates in a lower sidewall portion 332b. The chamber 322 also is formed by a bottom wall 378 and a top wall or cover 380. To the opposite side, cabinet 352 defining the right-hand cleaning chamber 320 is not exactly a mirror image of cabinet 350, however, opposite vertical sidewall 334, there is provided a vertical sidewall 382 having a doorway or opening 384 of matching configuration and sized slightly larger than door 362. The doorways 384 and 376 may be identically configured and dimensioned. Cabinet 352 is closed off at the top, by top wall 386 and partially at the bottom, by a bottom wall 388. As may be appreciated, when the lateral shuttle assembly 360 is shifted to either of its extreme positions by the shuttle drive hydraulic cylinder 366 the door 362 is either within the doorway 376, or doorway 384, at which time a clean mask is within the presentation area and a mask to be cleaned is presented to a given cleaning chamber, as at 320 and 322. This permits one of two masks to be cleaned while the other mask is being employed in a screening operation or being transported to or from the screener console 114.

Figure 12:
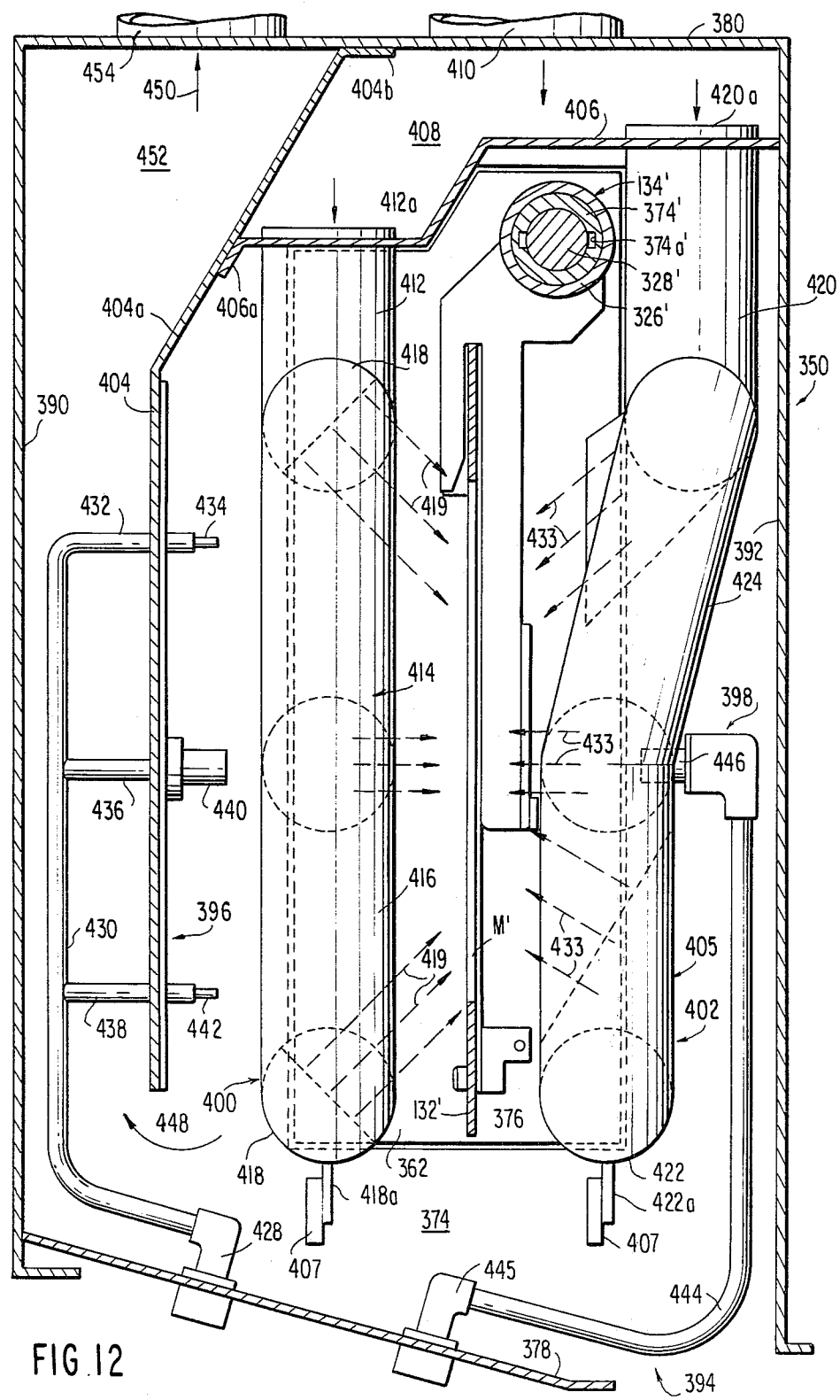
FIG. 12 is a vertical, transverse, sectional view through one of the cleaning chambers of one of the mask cleaning units of the screening machine of FIG. 1.
Figure 13:
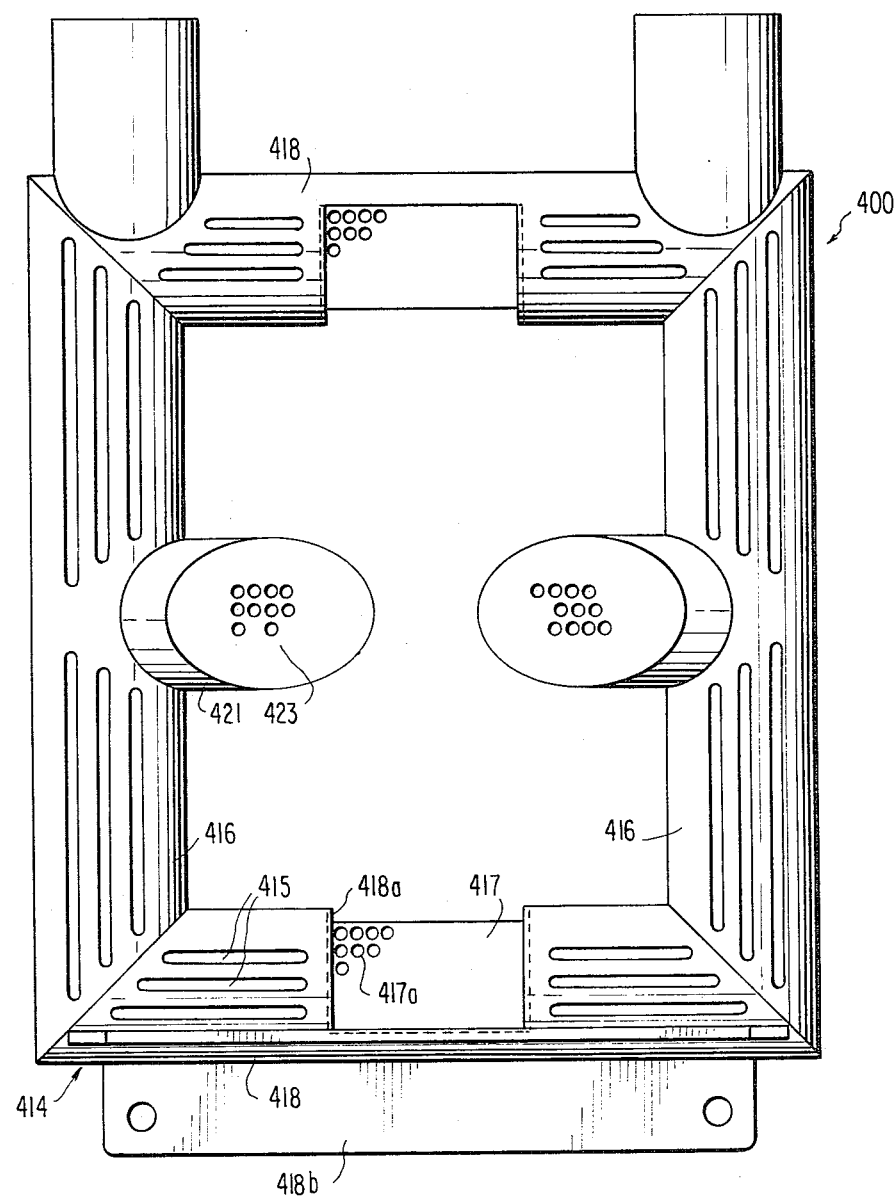
FIG. 13 is a vertical elevational view of one of the dryer manifold assemblies of the cleaning chamber of FIG. 12.

The nature of the means for achieving the cleaning of a mask when positioned within a cleaning chamber 320 or 322 to the rear of each screening station may be best appreciated by reference to FIGS. 12, 13 and 14. Opposed front and rear walls 390 and 392 are shown in FIG. 12, closing off chamber 322, except that the bottom wall 378 while being connected at its front to a vertical front wall 390, does not extend completely to the rear wall 392 of cabinet 350. It stops short of that wall and forms a gap 394 functioning as a drainage outlet for the cleaning liquid which is spray applied to both sides or faces of a mask such as mask M', including mask frame 132' and borne by mask frame carrier 134'. The sectional view of FIG. 12, which at right angles to th plane of the mask frame 132' shows the nature and placement of the nozzles for applying a commercial cleaning solvent in liquid form, such as perchlorethylene ("perchlor"), to opposite surfaces of mask M, positioned vertically within chamber 322, as well as dryer manifold duct assemblies for supplying drying air under pressure thereto. The air is blown against opposite faces of each mask to dry the masks subsequent to spraying solvent and to insure removal of any paste adhering to each mask during the screening operation.

In FIG. 12, the sidewall 374 can be clearly seen as well as doorway 376 within which at this moment is positioned the door 362 closing off chamber 322, other than drainage outlet 394 in the lower right-hand corner of that figure. The cabinet 350 is provided with certain interior wall and support structure for supporting the elements making up the a first spray assembly indicated generally at 396 and a second spray assembly indicated generally at 398. Further a corresponding pair of mask top and bottom dryer manifold duct assemblies, 400 and 402, respectively, are provided. In this respect, a vertical baffle plate 404 is suspended some distance from the front wall 390 by way of an inclined wall portion 404a mounted to the upper wall 114 by a flange 404b. Further, an irregular transverse support plate 406 spaced somewhat below the upper wall or cover 380, is fixed at one end to the rear wall 392 and is connected at its opposite end by way of flange 406a to the inclined wall portion 404a of the plate 404. Plates 404 and 406 partially define an air inlet plenum chamber 408 near the top of cabinet 350 which opens to an air inlet duct 410 feeding dryer air to this inlet plenum chamber.

Dryer manifold duct assembly 400 comprises two vertical cylindrical ducts 412 having their upper ends 412a open and projecting through the transverse plate 406, thus receiving air from plenum chamber 408. Each vertical duct 412 is connected at its lower end, 412b, to an upper, transverse or horizontal duct section 418 forming one leg of a rectangular manifold duct loop 414 indicated generally at 414. Corresponding lower cylindrical duct section 418 parallels the upper duct section 418, and these duct sections are coupled at their ends to laterally opposed vertical duct sections 416. On the surfaces of the manifold duct loop 414 facing the front of mask M', there are provided a plurality of elongated, parallel slots 415, the slots 415 covering approximately 90° of the circumference of the cylindrical duct section facing the perimeter of the mask M. The upper and lower transverse duct sections 418 includes cut-out portions 418a at their center, the ducts being cut through approximately 180° circumferentially, and across which is mounted an inclined mesh or perforated plate or wall 417, bearing perforations 417a, through which the air escapes in a concentrated flow path angled as indicated by arrows 419, FIG. 12, against the front of mask M'.

Contrary to transverse or horizontal duct sections 418, the vertical duct sections 416, at their centers, are provided with tubular projections forming nozzles or air deflectors 421 opening at one end to the interior of the vertical duct sections 416 and having their opposite ends closed off by mesh or a perforated sheet member 423, providing concentrated air flow towards the center of the mask M'. As will be appreciated later, the nozzles 421 extend toward each other and face the center of the mask M' to straddle opposite sides of the perchlor main spray nozzle 440 of assembly 396. The lower transverse duct section 418 may comprise an integral flange 418b which is fixedly mounted to a transverse support bar 407 which extends across chamber 322.

To the opposite side of the mask carrier assembly 134' is a similarly constructed by slightly different dryer manifold duct assembly 402. This assembly, which may be seen in FIGS. 12 and 14, includes a pair of vertical air flow inlet ducts 420 which have their upper ends 420a projecting through transverse plate 406, the ends of the inlet ducts 420 opening also to plenum chamber 408 and directing dryer air flow under pressure into a rectangular manifold duct loop indicated generally at 405 as defined by upper and lower transverse or horizontal cylindrical duct sections 422 and bent vertical cylindrical duct sections 424, the sections being sealably joined together at their ends. The upper half of the duct sections 424 are tilted away from the face of the mask M'.

In this case, at the center of respective vertical and horizontal and vertical duct sections 422, 424, there are provided tubular air nozzles or air deflectors 427, opening to the duct interior and having their ends remote from the duct sections closed off by mesh or a perforated plate 429, such that concentrated air flow is directed towards the center of the mask M' on that side. Also at the point, singular impingement of perchlor or like cleaning liquid from a single perchlor nozzle 446 of spray nozzle assembly 398 is effected on this side of the chamber. The lower transverse or horizontal duct section 422 of manifold duct assembly 402 is provided with a flange 422a for fixedly mounting the lower end of that manifold assembly to a transverse support bar 407 which spans the chamber 322 on that side.

In like manner to manifold assembly 400, the duct sections of assembly 402 include spaced, parallel, elongated slots 431 on surfaces which, quadrantwise, face mask M' from the outer edge towards the center thereof. All of this manifold ductwork may be formed of stainless steel or other cylindrical metal tubing. As may be appreciated, by having the lower end 404c of baffle plate 404 terminate some distance above the bottom wall 378 of cabinet 350, air after striking both sides of the mask M' escapes from the area of impingement through the gap between front wall 390 of the cabinet and the baffle plate 404 and enters an outlet plenum chamber 452 leading to one or more outlet ducts 454. Ducts 454 open to the outlet plenum chamber 452 through top wall 380. Air flow exiting from nozzles or air deflectors 427 towards the bottom side of mask M' effects concentrated air impact within the area facing the single perchlor nozzle 446, as indicated by arrows 433.

The dryer manifold duct assemblies 400 and 402 function to direct air at various angles against the opposite sides of the stencil mask M'. Both dryer manifold duct assemblies 400 and 402 include a number of angular air emitting defectors or nozzles and various non-angular peripheral air emitting slots. Central flat walls 417 bearing perforations 417a or mesh define air emitting areas for transverse air manifold ducts 418 to concentrate air flow for assembly 400. The configuration of the manifold duct assemblies 400 and 402 are such that air flow favors a given direction of flow and is transverse to the plane of mask M' such that some air flows through the cut outs or perforations within the stencil mask M'. Preferably, air flow is concentrated so that the dominant air flow is from the rear wall 392 towards the front wall 390 of cabinet 350. The forced air flow readily blows the liquid solvent from the mask M' and any captured residue of paste, assisting in the vaporization of the perchlor liquid and rapidly drying the mask.

The cleaning liquid is supplied to spray assemblies 396 and 398 from a common supply (not shown) which also may be common to both the right hand cleaning chamber 320 for this half of the machine, as well as the two cleaning chambers to the rear of screening 14a. In that respect, the timed delivery of cleaning liquid under pressure to the spray assemblies is achieved by appropriate control means including valving (not shown) within the supply lines leading to respective assemblies 396 and 398. Spray assembly 396 is comprised of an inlet fitting 428 mounted to bottom wall 378 connecting a supply line (not shown) to a main distributor tube or pipe 430 leading by way of a branch line 432 at the top, to a pair of upper perchlor bead nozzles 434, branch line 436 to central perchlor main nozzle 440 facing the center of mask M', and branch lines or tubes 438 to a pair of lower perchlor bead nozzles 442, matching nozzles 434. Branch lines 432, 436 and 438 project through the vertical baffle wall 404. Wall 404 may function as a suitable support for the major components of nozzle assembly 396. The orientation of the perchlor main nozzles and perchlor bead nozzles for assembly 396 are interior of loop 414. To the opposite side, a tube or line 444 leads from fitting 445 connected to the common supply by means (not shown), to a centrally positioned main perchlor nozzle 446 for applying cleaning liquid as a high pressure spray against the center of bottom face of the mask M' as presented to the cleaning chamber 322 by mask frame carrier 134'. Conventionally, there is gravity flow of perchlor liquid back to the supply tank (not shown) which functions as a sump and is positioned immediately below the bottom wall 378 of chamber 350, or alternatively a collector is employed feeding to the perchlor supply tank which may in fact be behind the mask removal station or presentation area. The return flow may be filtered, and the filtered liquid forcibly pumped to supply fittings 428 and 445 under program control.

Further, fans may be carried by air inlet duct 410 and/or the air outlet duct 454 for forced air flow to the chamber 322 and removal of the air flow from the outlet air manifold 452. A typical operation of the automatic multi-layer ceramic (MLC) screening machine 10 involves automatically cleaning and drying of the central mask used to print the conductive patterns on the ceramic green sheets. Molybdenum paste which is screened through the stencil mask and which has a consistency somewhere between that of tar and putty, must be cleaned after each green sheet is screened. The unit just described effectively automatically provides cleaning of the masks and drying of the same prior to their selective presentation at the screening station to a new green sheet.

In operation, the mask frame carrier 134' is moved from the presentation area or mask removal station 324 to the left by retraction of hydraulic cylinder rod 368 with the lateral shuttle assembly 360 moving from right to left, FIG. 11. When the door 362 closes off doorway 376, the mask carrier 132' has positioned the mask M' in a proper position to receive the perchlor mask cleaning spray which is directed against opposite faces of the mask M'. The cleaner emanates in a spray form from nozzles 434, 440 and 442 on the left side of the mask and from the single nozzle 446 on the right side. After the timed spray application of cleaning liquid under a given pressure, to both sides of mask M', the flow of cleaning liquid is terminated. Air under pressure (heated if necessary) flows through the inlet tube 410 into the plenum chamber 408 where, some of the air flows to left-hand dryer manifold duct assembly 400 while additional air enters right-hand dryer manifold duct assembly 402. Forced air discharged through the air assemblies is concentrated against the mask M' by nozzles 421, 427 to blow off residual liquid and entrained paste (if any) for the mask. This perchlor liquid escapes through the gap 394 at the bottom of the chamber, although some of the liquid may be carried off as vapor within the air stream. The air escapes the chamber 322 as indicated by arrows 448 and 450, FIG. 12, though outlet plenum 452 defined by front wall 390 and the vertical baffle plate 404. into an air discharge tube 454. The air escaping from the chamber may be filtered and recirculated by fans or blowers (not shown) which creates the forced air flow circulating through the chamber from the inlet duct 410 to the outlet duct 454. Air flow from the slots 415, 431 dries the mask including frame 132', which mask frame is harder to dry.

The makeup of the mask frame carrier 134 and the spline or key drive to effect rotation of the outer sleeve 326 relative to the rotary drive shaft 328 may be further appreciated from viewing this assembly in FIG. 12. The shaft 328 which bears the keys 376, has no keys in this chamber area. Outer sleeve 326' bears integrally a sleeve 374' bearing key slots 374a'. In FIG. 12, with the mask frame carrier 134' shifted by the lateral shuttle assembly out of the presentation area or mask removal station, the shaft 328 in the chamber 322 having no keys can rotate relative to the mask frame carrier 134' which is retained in its vertical orientation by gravity effect. Mask frame 132 and its mask M having been cleaned and moved from cleaning chamber 320 to the left, into the presentation area 324, will be rotated with the shaft 328 from a vertical orientation to a horizontal orientation and raised to a horizontally aligned position with respect to the mask removal mechanism 138. The keys 376 which are on shaft 328 only within the presentation area are received within the keyways or slots 374a thus driving the key sleeve 374 which is fixed to outer sleeve 326 and rotating arms 336 bearing the mask frame 132 of the mask frame carrier 134.

As may be appreciated from viewing FIGS. 3 and 4, other than at given single locations such as where the fixture post 58 of fixture 50 borne by carriage 30 is in axially alignment with cylinder rod 70 of the initial height adjustment cylinder 72 at the screening station, the height of the fixture 50 throughout its carriage borne path is generally determined by the fixed height of cam rail 62. That height of fixture 50 is at a lowered position relative to pickup and placement head 74 subsequent to a paste screening of the greem sheet. As evidenced in FIG. 2, with the pickup and placement head 74 raised, the carriage 30 and its fixture 50 are free to move along a horizontal path as defined by the base rails 28. Further, as indicated in FIG. 2 the fixture 50 rests directly on the top of carriage 30, that is it is in its lowermost position and the follower cam roller 60 is in contact with the upper edge 62a of the cam rail 62, FIG. 4. Full extension of the carriage drive hydraulic cylinder shifts the carriage 30 and the carriage borne fixture 50 from the screening station 14 to unloading station 16, FIG. 1, via hydraulic cylinder 76.

Figure 15:
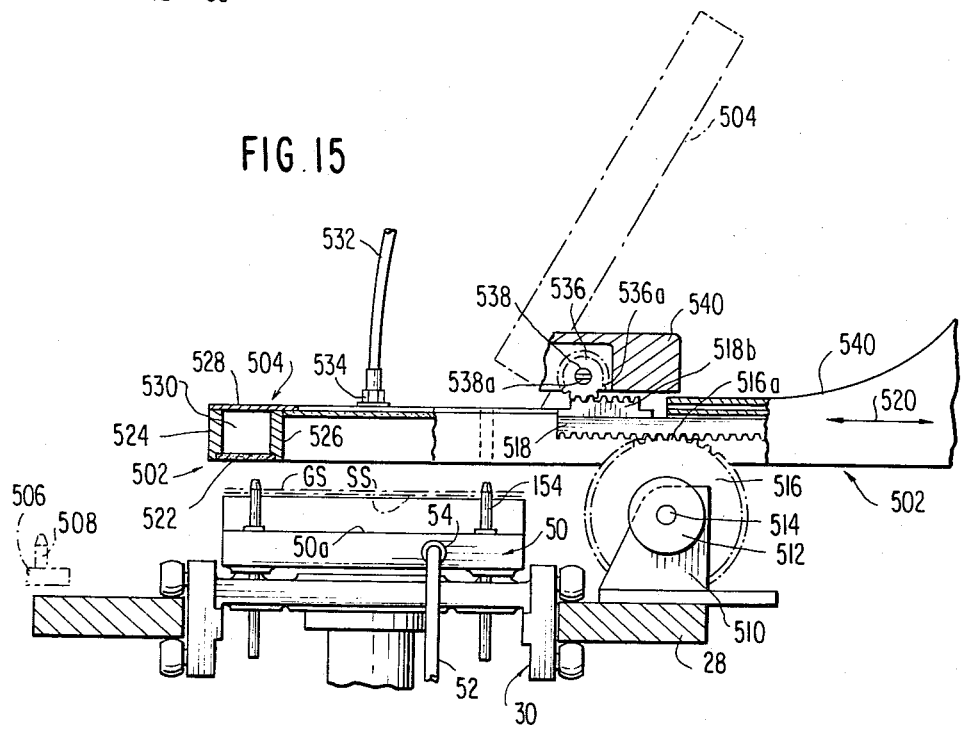
FIG. 15 is a transverse, vertical sectional view of the unloading station of the screening machine of FIG. 1.

The now screened green sheet and its underlying spacer sheet may be removed from fixture 50 at the unloading station 16 whose basic content or makeup may be seen in FIG. 15. At this station, the front of the machine overlying the base rails 28 there is an absence of console or cabinet structure. The basic element of the unloading station 16, which functions also to unload screen green sheets from the second carriage 30a corresponding to the left half of the machine 10 and which is borne commonly by rails 28, involves a front to rear, horizontally moveable, unload head indicated generally at 502. Head 502 is borne by laterally spaced guides for movement transverse to the base rails 28, which guides function to support the head 502 for movement forwards of a first, retracted position shown. A pivotable cover 504, carried by head 502, overlies fixture 50 borne by carriage 30, or the fixture 50a borne by carriage 30a of the corresponding left half of the machine, as per FIG. 1. Cover 504 is aligned with the center line of the fixture 50 when the head 502 is in retracted position.

The head 502 while being supported by guides, is rack and pinion driven to a second, frontal displaced position where, it overlies an uload tray, indicated at 506 in dotted lines, FIG. 15. Tray 506 includes pins 508 projecting upwardly and functioning to guide the green sheets downwardly onto the stack of green sheets which accumulate on the tray 506. However, the stack of paste screened green sheets, at this point, are not separated from each other by spacer sheets. After the screening operation, it is necessary to remove the spacer sheets so that the green sheets form an integrated stack prior to subsequent placement of an accumulated stack of green sheets in an oven where the green sheets are cured and are thermal bonded to each other.

In the somewhat schematic representation of FIG. 15, to the side of right hand rail 28 bearing carriage 30 by way of rolls 40, a bracket 510 supports a drive motor 512 whose shaft 514 bears, on the opposite side of bracket 510, a large pinion gear 516, whose teeth 516a are in mesh with rack teeth 518a of a lower rack 518 fixed to the head 502. Energization of the motor 512 acts to drive the head 502, via rack 518 along a horizontal path as indicated by double headed arrow 520. The cover 504 is provided about its periphery with a porous member as in 522 which defines, with vertical wall members 524 and 526, and an upper wall 528, a peripheral vacuum chamber 530. Vacuum is applied to that peripheral chamber by way of vacuum supply tube 532 which mounts to the cover by way of coupling 534. Further, the rack 518 is provided with an upper, much shorter length second set of rack teeth as at 518b which are in mesh with teeth 536a of a smaller diameter pinion 536, fixed to a shaft 538, so as to rotate with that shaft. The shaft 538, which rotates about its horizontal axis terminates at its ends in flatened shaft portions as at 538a which flaten shaft portions normally ride within the grooves (not shown) within fixed guide member 540 which functions to guide the head 502 during its transverse horizontal movement.

In one form of the invention, during traverse of the head 502 as a result of positive drive by way of pinion 516 and rack teeth 518a, the pinion gear 536 is prevented from rotation since the flatened portions 536a of the shaft supporting that pinion restrict rotation of the shaft during traverse of the rack 518. However, when the head 502 is driven from a first position in line with the fixture 50, and after vacuum pressure has been applied to chamber 530 such that green sheet GS and the underlying spacer sheet SS are vacuum lifted from the fixture 50 onto cover 504, towards a forward, second position overlying the unload tray 506, at some point in this travel, there is no restraint to rotation of shaft 538. Continued movement of rack 518 causes the rack teeth 518 to drive the pinion in a clockwise direction pivoting the cover 504 to the dotted line, open position, FIG. 15, whereupon, the spacer sheet SS can be manually removed from the green sheet GS although, by continued application of vacuum pressure via vacuum supply tube 532, the green sheet GS remains on the cover.

After a reverse rotation of the cover, and pivoting to its horizontal or full line position, FIG. 13, and being aligned with the unload tray 506, vacuum pressure may be released from chamber 530 and the green sheet GS dropped by gravity. By the supply of positive air pressure through the same supply line 532, the green sheet can be forceably driven down towards the stack of green sheets on the unload tray. By the use of the pins 508, the green sheets are appropriated aligned on the stack. The stack can then be transported as a unit to the oven for curing.

Alternately, the unload head 502 may comprise a fixed member with the cover 504 being pivotably mounted thereto, and simply manually pivoted as desired to allow manual removal of the spacer sheet and secondly the green sheet, when the cover 504 is pivoted to the dotted line position shown in FIG. 15 at the unloading station.

Subsequent to transfer of the green sheet and spacer-sheet from the fixture 50 to the cover 504 of the unload head 502, the carriage is free to return its fixture to a load station to receive a new green sheet and its underlying spacer sheet for transport to the screener station for paste screening.

Machine Operating Sequence

As indicated previously, the automatic multilayer ceramic (MLC) screening machine 10, involving multiple stations, performs duplicate functions on sequentially fed ceramic green sheets. Synchronized unloading of the paste applied green sheets automatically, in sequence, is effected at the common unloading station 16 in response to stepped movement of the paste screened green sheets borne by carriages 30 and 30a from opposite sides to that station and beneath unload head 500. Hydraulic, pneumatic or electrical motors provide the drive to the moveable elements. The moveable elements move within limits defined by physical stops. These movements are sensed by appropriate sensors. The sensors feed signals to a control processor (not shown) which supplies control signals to the various hydraulic pneumatic and electrical drive motors and mechanisms. This control processor is further connected to a control console 600 which may be a part of a overlying cabinet structure above the consoles at the screening stations 14 and 14a. The control console 600 is provided with various indicator lights, digital readouts and manually operable input means such as a push button matrix 602 bearing a plurality of depressable push button operated switches 604 which are electrically connected to the control processor. Further, the sensors located at the various stations for sensing the position of moveable elements as well as the green sheets and their underlying spacer sheets, feed signals back to the control processor. The control processor program means is responsive to these signals and to push button inputs which may include push buttons particularly adapted for setting the program as well as push buttons for manual override of the automatic control program to accelerate or otherwise vary cyclic operation of the machine components.

Figure 16:
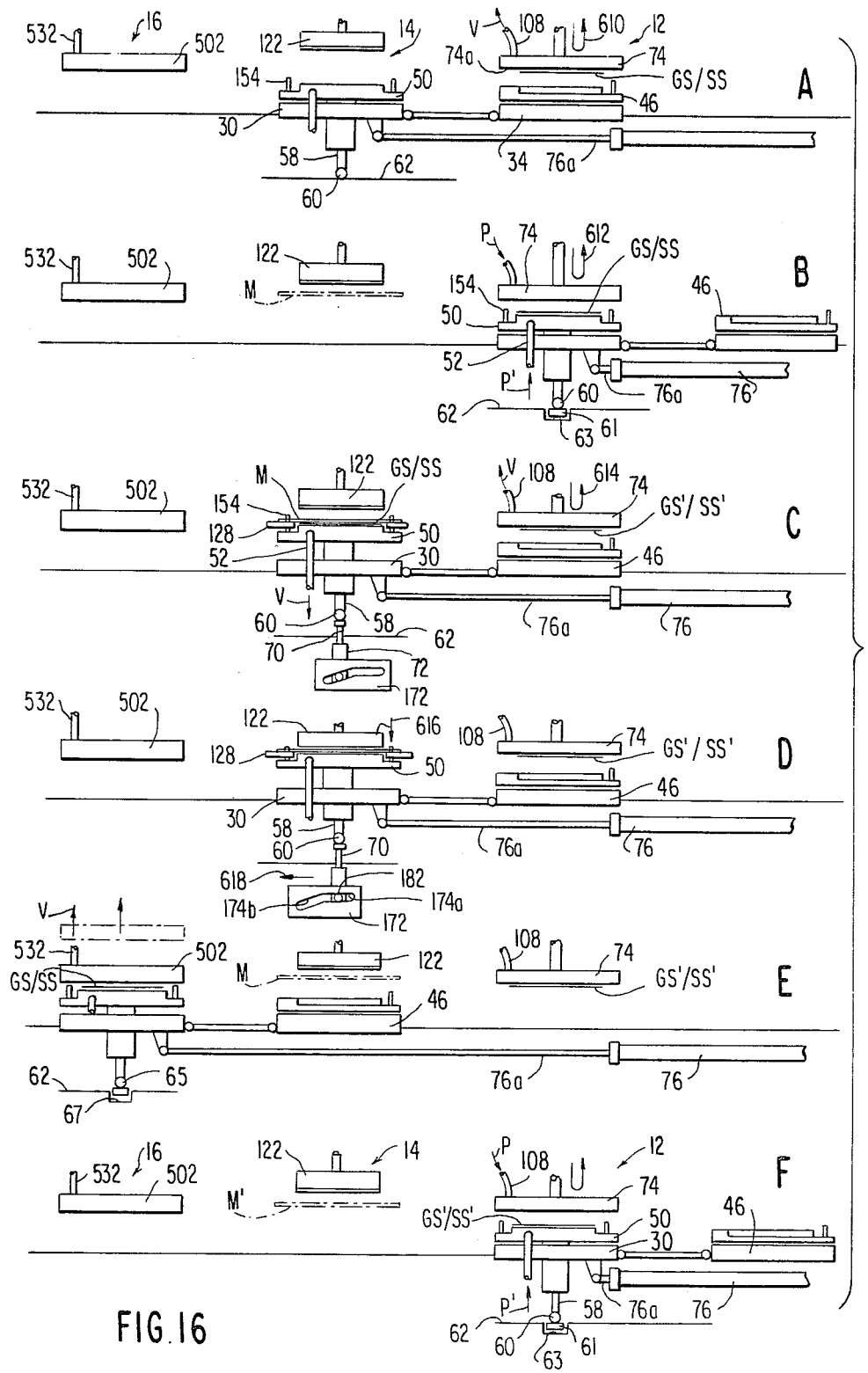
FIGS. 16A–F are sequential longitudinal, schematic views of one half of the automatic screening machine of the present invention, illustrating in sequence the operation of given screening and loading stations and a common unload station, through one machine cycle.
Figure 17B:
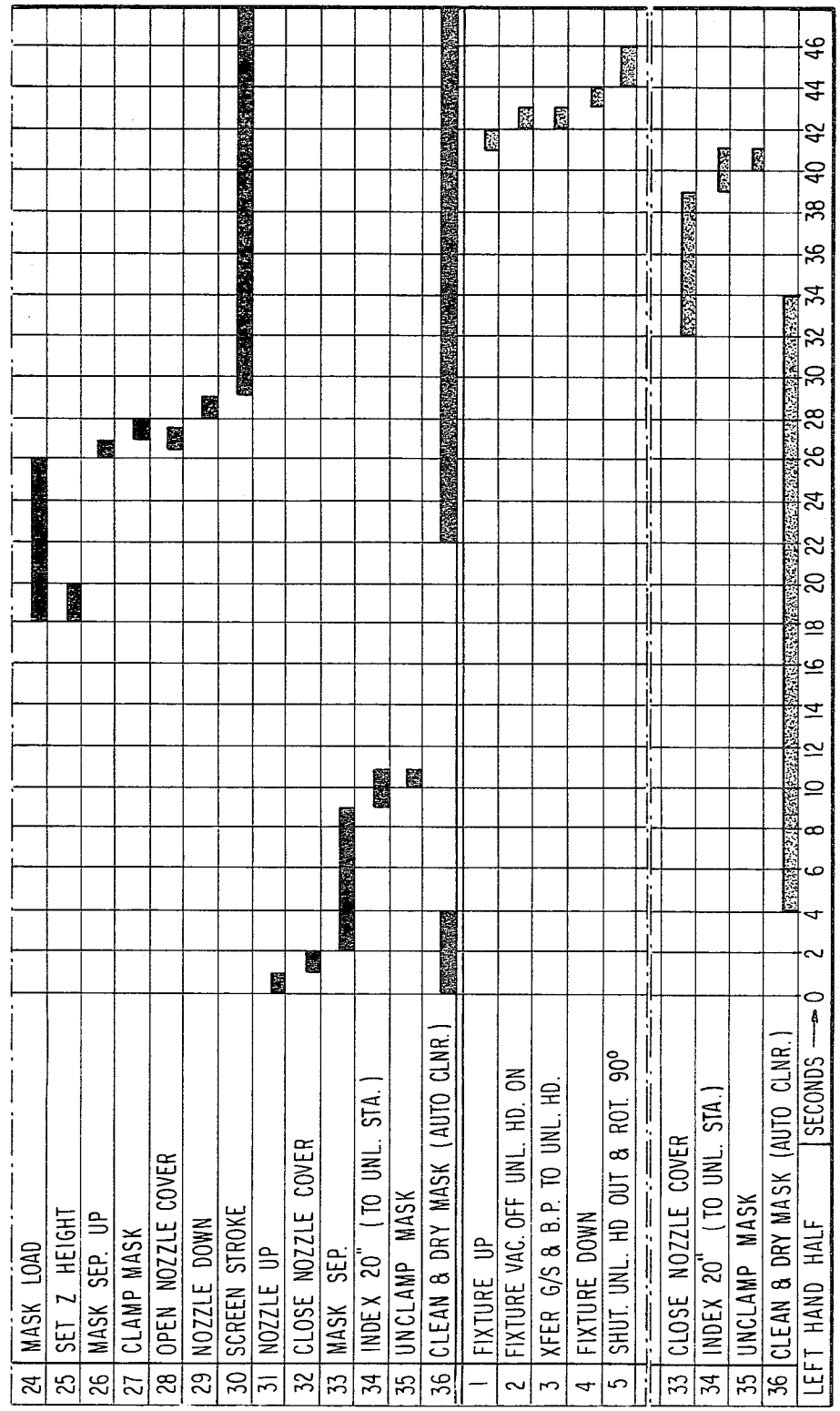

The sequence of operation for the machine proper and the synchronized operations for the two halfs of the machine that is the right half of the machine described in detail and comprised of loading station 10, screening station 14 and the unload station 16 (common to both halfs) and, the left hand half of the machine comprised of loading station 12a and screening station 14a and the common unload station 16 may be best appreciated by further reference to FIGS. 16A-F and FIGS. 17A and 17B. FIGS. 16A-F are sequential schematic front elevational views of the right hand half of the machine constituted by stations 10, 14 and 16. FIGS. 17A and 17B are timing diagrams showing the timed cyclic operation of machine components. FIG. 17B includes in broken line fashion certain portions of the timing diagram as it applies to the left hand portion of the machine performing duplicate functions to the right half, which are fully illustrated. Significantly, the components operate out of phase so that the carriages 30 and 30a do not arrive at the common unload station 16 at the same time.

In addition to this synchronized movement, controlled by the program of the control console 600, a safety device may be mounted to the front base rail 28, in the path of movement of the carriage, including switching means activated by the passage of a given carriage to the unloading station which means when activated, automatically functions to shut down the machine 10 should, invertantly, the other carriage approach the same unloading station and make contact with the common sensing means. This constitues an automatic override over the program provided by the control console 600.

Referring initially to FIGS. 16A through 16F which illustrates a single cycle for the right-hand half of the machine 10. The sequence, which takes approximately 48 seconds, is initiated by tray 46 being loaded to the trailer 34 at the loading station 12, FIG. 16A. Loading occurs by depression of the pickup and placement head 74 vertically downwardly and then upwardly while applying vacuum as indicated by the arrow V to supply line 108 leading to the pickup and placement head 74. When the head 74 moves to the extent where, it directly overlies the uppermost green sheet GS and its underlying spacer sheet SS of the tray borne stack the application of vacuum pressure causes the green sheet GS and spacer sheet SS to adhere to porous face 74a of the pickup and placement head 74. When the head 74 is again moved upwardly, as indicated by the curved arrow 610, the carriage 30 and its fixture 50 may be indexed left, to right, from screening station 14 to loading station 12 forcing the trailer 46 to move to the right. This permits the selected green sheet GS and spacer sheet SS to be transferred from the pickup and placement head 74 to the top of fixture 50, properly aligned therewith. Indexing is achieved by the compound hydraulic cylinder 76 having three positions, the first position of which is shown in FIG. 14B where the carriage 30 is moved to its extreme right hand position and with the cylinder rod 76a in its fully retracted position.

By the application of positive air pressure as indicated by arrow P, FIG. 16B, to supply hose 108 of head 74, and positive air pressure, arrow P', to supply hose 52 leading to the fixture 50, the green sheet GS and the underlying spacer sheet SS are floated off the pickup and placement head 74 and deposited onto head 50 guided by pins 154.

In accomplishing the transfer of the green sheet GS and underlying spacer sheet SS from the pickup and placement head 74 to fixture 50, the fixture 50 is raised slightly, for example one sixteenth of an inch by means of tee 61 within opening 63 of the cam rail 62 at the loading station 10 and centered with the pickup and placement head 74. Significantly, the tee 61 which is raised from a position flush with the upper edge 62a of the cam rail functions, by contacting roller 60 to raise the fixture 50 and thus the bullet nosed pins 154 to the extent where the bullet noses penetrates alignment holes within the green sheet and the underlying spacer sheet as they float from the pickup and placement head 74 onto the upper surface of fixture 50. The head 74 is then raised as per arrow 612. After vacuum pressure is applied to fixture 50 to hold the superposed sheets GS/SS in place, hydraulic cylinder 59, functioning to move the tee against the bias of a biasing spring, is deenergized permitting the tee 61 to move downwardly and flush with the upper surface 62a of the cam rail 62. Thus, at the loading station there is a very slight vertical displacement of the fixture 50 relative to the underlying and supporting carriage 30.

During this time, clean mask M is loaded by way of the mask removal mechanism 138 onto the mask holder clamp assembly 130 within the screening station 14 screener console.

Subsequent to this operation, FIG. 16C, the carriage 30 and fixture 50 are moved horizontally along the base rails 28 from the loading station 12 to the screening station 14 by a one half stroke of rod 76a of the compound hydraulic carriage drive cylinder 76. When carriage 30 is centered within the screener console and with the fixture post 58 aligned with cylinder rod 70, the green sheet 65 borne by fixture 50 is moved vertically into contact with the clamped mask M prior to sweeping the paste tube 122 across the top of the mask. The vertical motion imparted to fixture 50 involves three aspects. First, a full one and one half inch vertical rise is provided to the fixture 50 by extension of cylinder rod 70 by hydraulic fluid application to hydraulic cylinder 72. Secondly, an approximately one quarter inch further rise is effected by initial horizontal displacement of slide 172 bearing cam slot 174 and specifically by cam follower roller 192 movement along inclined portion 174b of that slot. A final incremental vertical movement is effected by the final horizontal movement of the slide 172 bearing the cam slot wherein the cam slot portion 174a provides a 0.009 inch maximum vertical rise to cam follower roller 182 applied to the fixture 50 and thus to the green sheet GS which is pressed against the bottom of the mask M. The extent of horizontal movement of slide 172 and thus the vertical rise provided by the two part cam slot 174 is controlled by pre-programming the extent of horizontal slide movement of Z adjustment mechanism described previously, which may be effected by the push buttons 604 of the control console 600. Fixture 500 remains under vacuum pressure to maintain the green sheet in its accurately aligned position previously effected at the loading station 12, during sweep of the paste tube 122 and its nozzle across the surface of the mask M.

In the mean time, with the trailer 46 positioned in alignment with the pickup and placement head 74 at the loading station 12, a second green sheet GS' and spacer sheet SS' are removed from the top of tray 46 by the application of vacuum pressure, arrow V, through vacuum supply line 108 to that member, upon a repeat of the lowering of that pickup and placement head 74 and return to the raised position, as indicated by arrow 614, FIG. 16C.

FIG. 16D depicts the actual screening process where the paste tube 122 has been lowered as indicated by arrow 616 and where, a sweep of the tube 122, from the rear of the screener console forward, is effected across the face of the mask M held by the mask clamps. Further, during this process the bullet nosed pins 154 penetrate appropriate holes as at 152 within the mask holder clamp assembly guide bars 138 to insure accurate alignment of the fixture held green sheet GS with mask M. Retraction of fixture 50 occurs thereafter, by movement of slide 172 to the left, arrow 618.

Turning to FIG. 16E, cylinder 76 is actuated to further extend rod 76a, driving the carriage 30 to its extreme left hand position where, the carriage 30 and fixture 50 underlie the unload head 502 at the unloading station 16. During this process, the paste applied green sheet GS which may have either or both, via holes filled with paste and paste pattern applied to the surface of the green sheet, is held in place on fixture 50 by vacuum pressure applied to that fixture. At the unloading station, FIG. 16E, the fixture 50 is raised from the carrier 30 by a given increment for example, three sixteenths of an inch, by raising of tee 65 from a position where its upper surface is flush with the upper edge 62a of the cam rail 62, thereby driving post 58 and fixture 50 upward by an extent where, the bullet nose pins 154 of the fixture 50 penetrate alignment holes 535 within the unloading station pivotable cover 504 of the unload head 500. The vertical rise of the fixture 50 is sufficient to cause the green sheet GS to move into contact with the bottom of the unload head cover 504 where it is held thereto by the application of vacuum pressure as indicated by the arrow to vacuum supply tube 532 of that member. The green sheet is held to the surface of the pivotable cover 504 particularly about its periphery. The dirty mask M is shown in FIG. 16E as still at the screening station. Mask replacement of a clean mask M' for dirty mask M may be achieved any time after use but, in the illustrated sequence, it occurs within the portion of cycle evidenced by FIG. 16F.

FIG. 16F illustrates the retraction stroke for the compound hydraulic cylinder 76 wherein rod 76a moves to the right within the hydraulic cylinder causing the carriage 30 to move its fixture 50 from unloading station 16 to loading station 12. It's then aligned with the the pickup and placement head 74. A new cycle starts with positive air pressure P' being applied to fixture 50 and P to pickup and placement head 74 to float the second green sheet GS' and its spacer sheet SS' onto fixture 50. This involves the raising of the fixture 50 slightly via tee 61 to initially project the bullet nosed ends of pins 154 into the alignment holes of the green sheet GS'. During transfer of the green sheet/spacer sheet GS'/SS' to the fixture 50, tee 61 is depressed to the level 62a of the upper edge of cam rail 62. Fixture 50 then has applied thereto, vacuum pressure instead of positive air pressure P'. Transport of the second green sheet/spacer sheet array takes place from loading station 12 to screening station 14 with mask M, being replaced by mask M' as shown in dotted line fashion FIG. 14F, which changes effected immediately prior to this transfer.

Turning next to FIGS. 17A and 17B, the timing diagrams illustrate the totality of 36 different machine component functions or operations for the right hand section or portion of the machine 10, while the figures also illustrate at broken lines a portion of a similar list of functions or operations for the left hand position of the machine. The machine left hand half components operate distinctly out of phase with respect to the components for the right hand half. Further, it must be kept in mind that the unloading station 16 is common to both halves of the machine, the carriage and fixture for one half of the machine reaching the common unloading station at a time in the machine cycle which is distinctly different from the time in which the other carriage and fixture reaches the same unloading station.

The complete cycle of operation takes 48 seconds. Arbitrarily, during the first one second unterval, FIG. 17B, the machine components illustrated in FIGS. 16A through 16F are as shown in FIGS. 16B and 16E, where the screening stroke has been accomplished. Operation 31 involves the nozzle 122 moving from its lowered position to its raised position. This takes approximately one second. The nozzle cover or shutter is closed during the second second, operation 32. Simultaneously, with respect to the dirty mask M', that mask M' is being cleaned within cleaning chamber 322 for return to the screening area 126, as indicated at M' in dotted lines of FIG. 16F.

At the two second point of the cycle, operations 33 commences, which is a mask separation operation involving preferably a two speed separation in which the fixture 50 borne by carriage 30 separates the underlying green sheet GS from mask M at an initial relatively slow speed by movement of slide 117 to the right, FIG. 16d, with the cam follower roller within slot portion 174a. Subsequently, separation occurs at a much greater speed when the cam follower transfers to the more steeply inclined slot portion 174b. Finally maximum vertical drop is provided by operation of hydraulic cylinder 72 and retraction of cylinder rod 70. This operation takes approximately seven seconds and terminates at the nine second point.

At the termination of mask separation, operation 33, the carriage 30 and fixture 50 are in condition to move the screened green sheet from the screening station 14 to the commun unloading station 16, which operation 34 is illustrated at FIG. 16E. The indexing of carriage 30 to the unloading station is initiated at the nine second point and terminates at the eleven second point.

Meanwhile, operation 35 is effected to unclamp the mask M at screening station 14 which action takes one second.

Operation 1, FIG. 17A, occurs after the fixture 50 borne by carriage 30 reaches the unloading station 16. The fixture 50 is raised an incremental distance, which may be 3/16 of an inch, that movement being initiated at the eleventh second and taking approximately one second. Upon raising of the fixture 50, the vacuum pressure is terminated at fixture 50 and vacuum is applied at the unload head 502, operation 2. This takes place at the twelfth second, simultaneously with operation 3, constituting a transfer of the green sheet GS and spacer sheet SS to the unload head 502 and specifically to the bottom of pivotable cover 504.

Operation 4, initiated at the thirteenth second, involves the dropping of fixture 50 by de-energization of tee 65, dropping post carried roller 60 back to the level of the cam rail 62. At the 14 second point, operation 5 is initiated involving the shuttling or transverse shifting of the unload head 502 forwardly and out of its position of alignment with the path of movement of carriage 30 and fixture 50, and rotation of cover 504 approximately 90°, this action taking two seconds.

Operations 3, 4 and 5 occur when the components are as indicated schematically in FIG. 16E.

Operation 7 involves an optional feature of the invention, that is, air blown cleaning of fixture 50 by means (not shown) during index of the fixture 50 by way of carriage movement from the common unloading station 16 back to the loading station 12, as per the sequence of FIGS. 16E–16F. Operation 6 is the index of the carriage 30 and fixture 50 borne thereby under a full stroke of hydraulic drive cylinder 66, which takes four seconds and is initiated at the sixteenth second point of the cycle. Meanwhile, at the eighteenth second, the mask unloading and masking loading (operations 23 and 24), respectively, are initiated, which operations are terminated at the twentysixth second point of the cycle.

Simultaneously, eighteen seconds into the cycle, the machine operator, by manual depression of push buttons 604, sets the height adjustment mechanism 156 for positioning fixture 50 at screening station 14 to the desired height, corresponding to known parameters with respect to the ceramic green sheet thickness, mask thickness, etc.

At the twentyth second of the cycle, subsequent to rotation of cover 504 to a manual access position for permitting manual stripping of the underlying spacer sheet SS, the unloading head cover 504 may be rotated back to horizontal position manually by the machine operator. This places the cover 504 in position to permit vacuum release of the underlying green sheet GS at the termination of vacuum supply to the unload head cover 504. Operation 9 takes approximately four seconds.

Meanwhile, the second green sheet GS' and underlying spacer sheet SS' which are vacuum maintained on the bottom of the loading station pick up and placement head 74, are transferred to the fixture 50, now free of a green sheet and spacer sheet and returned from common unloading station 16 to the loading station 14, FIG. 16F. Operation 13 is initiated involving the application of positive air pressure, as at P', to tube 52 leading to fixture 50 and raising of tee 61, effectively lifting the fixture 50 an incremental distance to cause the alignment pins 154 to rise vertically a corresponding distance towards the pick up and placement head 74 bearing the green sheet GS' and its underlying spacer sheet SS'. This operation takes approximately one minute and terminates at the twentyfirst second. At that time, operation 14 is initiated involving the vertical drop of the pick up and placement head 74 as per arrow 618, FIG. 16F, this operation 14 terminating at the twenty-third second.

Immediately upon initiation of the drop of the pick up and placement head 74, the vacuum pressure to the pick and placement head 74 is terminated and positive air pressure is applied as indicated by arrow P, FIG. 16F, and positive air pressure is applied to fixture 50, arrow P'. The green sheet GS' and the spacer sheet SS' are floated down onto the fixture, guided by the bullet-nosed alignment pins 154 projecting upwardly from the fixture 50. This operation which begins at approximately the twentyfirst and one-half second point of the cycle, terminates at the twentyfourth second mark. Tee 61 is dropped out, causing the cam follower roller 68 to fall to the level of the cam rail 62 and carriage 30 and its fixture 50 are ready for indexing from the loading station 12 to screening station 14, as per operation 16, which terminates at the twentyfifth second point of the cycle.

Indexing of carriage 30 and fixture 50, operation 17, takes two seconds and terminates at the twentyseventh second point of the cycle. Forced air cleaning of the green sheet GS' may occur during this index by means (not shown) similar to that employed in the cleaning of the fixture 50 which is an optional step (operation 7), previously discussed. This operation 18 takes approximately one second and spans across the twentysixth second point of the cycle. With the second green sheet GS' now at screening station 14 for screening, a third green sheet and an underlying spacer sheet may be vacuum loaded to the pick up and placement head in an operation corresponding to that shown in FIG. 16A. Such action is initiated at the twentyninth second point of the cycle. However prior to that action, the dirty mask M is removed from the screening station and sent to the cleaning unit for cleaning of that mask, while clean mask M' replaces the dirty mask at the screening station. Upon reaching the screening station 14, by indexing of the carriage 30 (operation 17), the green sheet GS' and its spacer sheet SS' are raised into contact with the bottom surface of the mask M', operation 26. This operation is initiated in the last half of the indexing stroke at the twentysixth second and terminates at the twentyseventh second mark of the cycle. The nozzle cover or shutter is opened during operation 26 as per operation 28. Meanwhile, the clean mask M' which has been placed at the screening station 14, FIG. 16F, as per operation 25, is clamped in overlying position with respect to green sheet GS' as per operation 27, which is initiated at the twentyseventh second point of the cycle. Screening of the green sheet GS' occurs immediately after the nozzle 122 is moved downwardly into contact with the upper surface of mask M' as per nozzle downstroke operation 29, which operation is initiated at the twentyeighth second of the cycle and terminates one second later.

Screen stroke operation 30 takes nineteen seconds, being initiated at the twentyninth second of the cycle and terminating at the fortyeighth second mark. During this stroke, operation 12 may be initiated if necessary, that is, the placement of the green sheet/spacer sheet stack borne by tray 46 on trailer 34. The timing diagrams indicate that this operation takes from the thirtyfourth and thirtysixth second. Operationally, the tray 46 may be placed on or removed from trailer 34 at either the unloading station 12, as illustrated, or when shifted to the right of that station, at the position shown in FIG. 16B, assuming that there is access to the trailer at this time.

As may be seen from the timing diagrams, a full cycle of operations is now completed, taking the fortyeight seconds. The machine components are now in position to effect a second cycle of operations and in the first second of the next cycle, a nozzle up operation 31 occurs simultaneously with operation 36 involving the cleaning and drying of the dirty mask. Operation 36 is initiated at the twentysecond point and continues into the four second point of a succeeding cycle. As may be appreciated, the automatic machine functions or operations given by the timing diagrams may be readily varied to suit conditions at hand depending upon the nature of the paste being screened, the necessity or lack of necessity for automatically cleaning the mask after each screening operation as well as the necessity or desirability of cleaning the fixtures and/or the green sheets as they are moved stationwise. The various stations can be essentially closed off from each other and their operations isolated. Specifically, cleaning of the masks may occur without atmospheric contamination to the screening areas by solvent vapor leaking from the cleaning units to the screening stations.

While the invention has been particularly shown and described with reference to a preferred embodiment thereto, it will be understood by those skilled in the art that various changes in form and details may be made therein without departing from the spirit and scope of the invention.

What is claimed is:

1. In an automatic screening machine for screening a conductive material through a stencil mask and onto an underlying ceramic green sheet, the combination comprising:

an elongated rail structure having disposed in juxtaposition therealong and in order, a first loading station, a first screening station, a common unloading station, a second screening station, and a second loading station;

first and second carriage assemblies mounted on said rail structure for movement therealong;

means for moving said carriage assemblies along said rail structure from said loading stations through said screening stations to said common unloading station in opposite directions and selectively positioned thereat;

each carriage assembly including a green sheet support fixture;

a loading mechanism located at each loading station, said loading mechanism including a pick up and placement head for picking up a green sheet at one position on said carriage assembly and for transferring it to said support fixture;

said carriage assembly further comprising alignment means for aligning the green sheet as it is deposited on said support fixture;

a screening apparatus located at each screening station, each such screening apparatus including an assembly for fixing a stencil mask above and in alignment with a carriage assembly when at said screening station, a green sheet positioning mechanism for vertically raising said green sheet support fixture relative to said carriage assembly and into and out of a screening position in face abutment contact with said stencil mask, and an extrusion mechanism for screening conductive material through said stencil mask and onto said underlying green sheet borne by said support fixture; and control means operatively connected to said carriage movement means, said loading mechanism and said screening apparatus for effecting sequential loading of a green sheet from a stack of such green sheets on said carriage assembly onto said green sheet support fixture and in proper alignment therewith, transport of said green sheet to said screening apparatus, screening of said green sheet and transport of said screened green sheet to said common unloading station and for effecting such operations out of phase for respective carriage assemblies such that a screened green sheet from one of said carriage assemblies is positioned at said unloading station for removal from said fixture of said one carriage assembly, while, simultaneously a second green sheet borne by the fixture of said other carriage assembly may be screened at its respective screening station, and vice versa.

2. The automatic screening machine as claimed in claim 1, wherein each carriage assembly comprises a carriage mounted on said elongated rail structure for movement along said rail structure and wherein said support fixture is mounted on top of said carriage for movement vertically upwardly with respect thereto to a position where a green sheet on said fixture contacts the bottom of said stencil mask, and wherein said carriage assembly further comprises a trailer fixed to said carriage for movement with said carriage along said rail structure, said trailer being longitudinally displaced with respect to the carriage one station position, and being positioned on said rail structure to the side of said carriage remote from said common unloading station such that placement of a stack of ceramic green sheets on said trailer permits said pick up and placement head to pick up the topmost green sheet from said stack when said trailer is at said loading station, to hold the green sheet during movement of said carriage and trailer and subsequent deposit of said selected green sheet onto the top of said support fixture when said carriage assembly is moved along the rail structure such that said support fixture is shifted from said screening station to said loading station.

3. The automatic screening machine as claimed in claim 2, further comprising a cam rail fixedly positioned beneath said rail structure and extending generally the length of said rail structure between said first and second loading stations, said carriage assemblies each comprise a post fixed to the bottom of said green sheet support fixture and slidably projecting through said carriage, cam follower means carried by said post and movable therewith for contact with said cam rail for normally defining the vertical position of said fixture with respect to said carriage and wherein, said green sheet positioning mechanism, at said screening station, further comprises vertically displaceable means alignable with said post, adjacent said cam rail, and normally out of contact with said fixture post; whereby operation of said vertically displaceable means causes said post and said cam follower to be raised to forcibly drive said fixture and said green sheet borne thereto into contact with said overlying stencil mask.

4. The automatic screening machine as claimed in claim 3, wherein said common unloading station comprises a green sheet unloading mechanism, said green sheet unloading mechanism including a horizontally movable vacuum unloading head mounted above said rail structure and movable across said rail structure at right angles to the direction of movement of said carriage assembly from a first position alignable with said green sheet support fixture when said carriage is moved to said common unloading station to a second position to one side of said rail structure, said alignment means comprising green sheet positioning pins projecting upwardly from the upper face of said fixture and projectable through alignment holes within said green sheets, said horizontally movable unloading head further comprises positioning pin alignment holes projecting vertically upwardly within said head from the surface facing said green sheet support fixture, and wherein said automatic screening machine further comprises vertically displaceable means carried by said cam rail and operatively engaging said cam follower borne by said fixture post at said unloading station for vertically raising said fixture and said green sheet borne thereby to force said positioning pins to project into said alignment holes of said unloading head, and said unloading head including means for applying vacuum pressure to the lower surface thereof to effect vacuum removal of the screened green sheet from said carriage borne support fixture onto the bottom of said unloading head; at said unloading station whereby, subsequent horizontal shifting of said unloading head from such first position aligned with said fixture at said unloading station to a position laterally displaced therefrom allows said screened green sheet to be gravity deposited by vacuum release to effect stacking of multiple screened green sheets.

5. The automatic screening machine as claimed in claim 4, further comprising means carried by said cam rail at said loading station for momentarily incrementally vertically raising said fixture post cam follower to cause the bullet-nosed alignment pins to momentarily penetrate the alignment holes of said green sheets during transfer of said green sheets from said pick up and placement head to said fixture and to follow said green sheets during said transfer when said fixture is positioned at said loading station.

6. The automatic screening machine as claimed in claim 4, wherein said unloading head comprises a cover pivotable about a horizontal axis parallel to said rail structure with said cover comprising said vacuum support means for said green sheet such that selectively, after said screened green sheet is transferred from said fixture to said unloading head pivotable cover and while vacuum pressure is supplied thereto, pivoting of said cover permits ready access to said said screened green sheet.

7. The automatic screening machine as claimed in claim 4, wherein said machine comprises horizontal guides slidably supporting said unloading head for movement horizontally between said first and second laterally displaced positions, and said means for horizontally moving said unload head between said first and second positions and vice versa comprises a motor driven pinion gear mounted for rotation about a horizontal axis, a first rack carried by said unloading head and meshed with said drive pinion such that energization of said motor effects rack and pinion driving of said unload head between said first and second positions, and said unloading mechanism further comprises a second rack on the side opposite that of said first rack, said cover is pivotably mounted to said head by horizontal shaft means, said shaft means include a second pinion gear fixed thereto and in mesh with said second rack, and said unloading mechanism further comprises means for restraining rotation of said shaft during unload head movement over a major portion of said movement from said first to said second position but allowing rack and pinion rotation of said shaft means during the termination of said unloading head movement to said second position; whereby, automatically, at the termination of movement of said unload head from said first unloading position to said second position said cover is pivoted from a horizontal, green sheet face down position to a position generally at right angles thereto, to expose said green sheet to the machine operator.

8. The automatic screening machine as claimed in claim 1, wherein said stencil mask includes a mask frame, and said screening apparatus further comprises guide means extending transversely of said rail structure and spanning across said rail structure and to the rear of the same for slidably guiding said mask frame, mask clamps mounted to respective guide means and movable between clamping and unclamping positions for locking said mask frame at a first forward position within said guide means, and said screening machine further comprises a mask removal mechanism operatively engaging said mask frame for shifting said mask frame from a said first forward position, centered with respect to an underlying carriage support fixture and in alignment with respect to the green sheet carried thereby, to a second, rearwardly displaced position remote from said fixture, and vice versa, and means operatively positioned with respect to said mask removal mechanism at said second position for engaging said mask frame for removing said stencil mask from said mask removal mechanism and for transferring said stencil mask to cleaning chamber means to the side of said mask removal mechanism, and for presenting to said mask removal mechanism a second clean mask for transfer to said screening position by subsequent movement of said mask removal mechanism from said second position back to said first position.

9. The automatic screening machine as claimed in claim 8, wherein said mask removal mechanism includes a horizontally shiftable bar, hydraulic cylinder means for moving said bar longitudinally, one end of said bar bearing a vertically displaceable mask holder pin, projectable within a pin receiving hole borne by a confronting edge of the mask frame, means normally biasing said pin into mask frame hole engaging position and manually operated means at said screening station and operatively engageable with said mask holder pin support means when said mask removal mechanism bar is in said first screening position for forcing said pin out of said pin receiving hole within said mask and permitting manual mask replacement to thereby permit variance in the pattern of conductive material screened onto the surface of each green sheet.

10. The automatic screening machine as claimed in claim 8, wherein dual cleaning chambers are mounted rearwardly of said screening station on opposite sides of said mask removal mechanism, a lateral shuttle assembly is operatively positioned adjacent said mask removal mechanism said lateral shuttle assembly comprises an axially fixed, rotatable shaft extending through said dual cleaning chambers, transversely of said mask removal mechanism and underlying the same and being mounted for rotation about its axis, a pair of mask frame carriers are mounted on said drive shaft for movement along the axis of said drive shaft and for selective rotation with said drive shaft about the axis of said drive shaft when positioned underlying said mask removal mechanism and in alignment therewith within a mask presentation area to receive a mask, first motor means is coupled to said drive shaft to rotate said drive shaft about its axis so as to rotate a given mask frame carrier and the stencil mask carried thereby when in said presentation area and second motor means is operatively coupled to said lateral shuttle assembly for laterally shifting said mask frame carriers on said drive shaft so as to present alternately, one of said mask frame carriers and its mask to said mask removal mechanism within said presentation area and the other within one of said mask cleaning chambers and vice versa; whereby during transport by said mask removal mechanism of a dirty mask from the screening station, subsequent to a screening operation, from said first position to said second position, said mask is moved into engagement with a given mask carrier within said representation area upon rotation of such given mask frame carrier within the presentation area to a first rotative position by slidable coupling of said mask frame to said mask frame carrier, and thence to a second rotative position to permit said lateral shuttle assembly to cause a dirty mask to be laterally shifted to a given cleaning chamber permitting liquid spray cleaning and forced air drying of the stencil mask carried thereby.

11. The automatic screening machine as claimed in claim 10, wherein said mask frame carrier includes a key slotted sleeve concentric with said drive shaft, and said drive shaft includes corresponding key means on the portion of said shaft within the presentation area and said mask frame carrier sleeve comprises radial arms at opposite ends thereof having longitudinally inwardly directed slots for slidably receiving opposed sides of a mask frame as said stencil mask is moved from said first position to said second position by said mask removal mechanism; whereby said mask frames are automatically moved into engaging position within said arms of said mask frame carrier during rearward movement of the mask away from said screening station and wherein after said drive shaft is rotated approximately 90° to change the orientation of said mask frame from a horizontal orientation to a vertical orientation, said lateral shuttle assembly shifts said sleeves so as to take a dirty mask from the presentation area and shift it laterally into one of the cleaning chambers disposed onto sides thereof, and wherein during subsequent rotation of said shaft in the opposite direction and movement of a clean stencil mask on the other mask frame carrier from a vertical position to a horizontal position, subsequent transport of the clean stencil mask from said second, rearward position may be effected by said mask removal mechanism to a first, screening position within the screening area while the dirty mask remains vertically oriented within said given cleaning chamber to permit sustained liquid spray application and subsequent forced air drying to ensure cleaning stencil mask.

12. The automatic screening machine as claimed in claim 11, where said dual cleaning chamber comprises generally closed cabinet means mounted to each side of said mask frame presentation area including laterally opposed vertical side walls, a doorway is formed within the vertical sidewall of each cabinet immediately adjacent the presentation area, and wherein said lateral shuttle assembly further comprises a door interposed between said mask frame carriers and movable laterally with said mask frame carriers on said drive shaft and being positioned such that regardless of lateral shifting of said lateral shuttle assembly, the door closes off the cleaning chamber doorway bearing the dirty mask being subjected to cleaning, from the clean mask within the mask presentation area.

13. The automatic screening machine as claimed in claim 12, wherein each cleaning chamber comprises a pair of spray nozzle assemblies positioned on opposite sides of said doorway and facing opposed sides of a stencil mask presented to the chamber after passage of mask frame carrier thorugh said doorway, and said chamber further comprises generally rectangular tubular manifold air duct loops on sides of said stencil masks, each rectangular manifold air duct loop facing the mask frame borne by said mask frame carrier, slots being provided within the surface of said tubular manifold duct loop facing the mask frame, and tubular air nozzles being fixed to said manifold duct loops, opening to the interior of said manifold duct loops and having mesh covered ends facing the surfaces of said mask such that forced air flow through said manifold duct loop causes concentrated air flow against the surfaces of the mask.

14. The automatic screening machine as claimed in claim 13, wherein said air nozzles on respective sides of said mask are numbered and positioned such that the air flow is oriented in a preferred direction to effect an unbalanced side to side air flow to insure removal of conductive paste from the mask pattern openings within the mask for thorough cleaning of the mask during the mask cleaning operation within said chambers.

15. The automatic screening machine as claimed in claim 14, wherein each of said rectangular manifold air duct loops comprise four right angle, end to end joined cylindrical ducts, and wherein at least one of said cylindrical ducts comprise an inclined mesh wall portion extending in a diametric plane through the center of said duct such that forced air is directed onto the mask frame and the mask carried thereby in a concentrated, angulated stream relative to the plane of the mask borne by the arms of said mask frame carrier.

16. An apparatus for automatically cleaning a stencil mask used to print a conductive pattern on a ceramic green sheet at a stencil mask screening station, said apparatus comprising:
a mask removal station located adjacent said stencil mask station screening and including a mask removal mechanism for transferring a stencil mask from the screening station to the removal station and vice versa;
a mask frame shuttle assembly including a carrier mechanism in juxtaposition to said mask removal mechanism for receiving and holding said stencil mask when moved by said mask removal mechanism from said screening station to said removal station;
a cleaning unit located adjacent said mask removal station;
said shuttle assembly further including means for moving said mask frame carrier assembly from the removal station to the cleaning unit and vice versa;
a spray nozzle system located within said cleaning unit for spraying the sides of said stencil mask with a cleaning fluid; and
a dryer manifold assembly located within said cleaning unit for blowing air against the sides of the stencil mask to remove any of residual conductive material and for drying of said mask.

17. The apparatus as claimed in claim 16, wherein said stencil mask includes a mask frame, and wherein said cleaning unit comprises dual cleaning chambers mounted rearwardly of the stencil mask screening station and on opposite sides of said mask removal station, said stencil mask screening station further comprises guide means for slidably guiding said mask frame during transverse movement and mask clamps mounted to said guide means and movable between clamping and unclamping positions for locking said mask frame at a first screening position, said mask removal mechanism includes means for operatively engaging said mask frame to shift said mask frame along said guide means from said first position within said screening station station to a second position at said mask removal station, and wherein said shuttle assembly comprises a rotatable shaft extending transversely across said mask removal mechanism and underlying the same and being mounted for rotation about its axis, said mask frame carrier mechanism comprises a pair of mask frame carriers mounted on said drive shaft for movement along the axis of the drive shaft and for selective rotation with the drive shaft about the axis of the drive shaft when underlying said mask removal mechanism and in alignment therewith, and wherein first motor means is coupled to said drive shaft to rotate said drive shaft about its axis so as to rotate a given mask frame carrier and the stencil mask carried thereby when in said mask removal station to selectively remove a dirty stencil mask from said mask removal mechanism or present a clean stencil mask to said mask removal mechanism, and a second motor means is operatively coupled to said shaft means for laterally shifting said mask frame carriers on said drive shaft so as to alternatively present one of said mask frame carriers and its attached mask to said mask removal mechanism within said mask removal station and the other within one of said mask cleaning chambers, and vice versa.

18. The apparatus as claimed in claim 17, wherein each mask frame carrier includes a keyway slotted sleeve concentric with said drive shaft, and said drive shaft includes corresponding key means on that portion said shaft passing through said mask removal station and each mask frame carrier sleeve comprises radial arms at opposite ends thereof and having opposed longitudinally inwardly directed slots slidably receiving opposed sides of a mask frame of said mask when said mask is moved from said first position at said stencil mask screening station to said second position at said mask removal station, with said mask frame carrier rotated to a first angular position and wherein subsequent to receiving said mask, rotation of said mask frame carrier sleeve 90° to a second angular position by operation of said first motor means driving said shaft changes the orientation of said mask frame from a horizontal orientation to a vertical orientation, and wherein subsequent operation of said second motor means causes said sleeves to shift laterally so as to remove a dirty mask from the mask removal station and place it within one of said cleaning chambers disposed laterally to the side thereof, while presenting a clean mask on the other mask frame carrier to said mask removal station such that subsequent rotation of said shaft by operation of said first motor means in the opposite direction causes a clean stencil mask mounted to the other mask carrier to move from a vertical position to a horizontal position within said mask removal station for presentation to said mask removal means.

19. The apparatus as claimed in claim 16, wherein said dual cleaning chambers comprise generally closed cabinet means mounted to each side of said mask removal station, said cabinet means including laterally opposed vertical sidewalls, a doorway is formed within the vertical sidewall of each cabinet immediately adjacent said mask removal station, and wherein said shuttle assembly further comprises a door interposed between said mask frame carriers configured and sized to said doorways and movable laterally with said mask frame carriers on said drive shaft and being positioned such that, regardless of lateral shifting of said lateral shuttle assembly, the door closes off the cleaning chamber doorway bearing the dirty mask whereby the dirty mask may be cleaned while isolated from the clean mask within the mask removal station for presentation to said mask removal mechanism.

20. The apparatus as claimed in claim 19, wherein each cleaning chamber comprises spray nozzle assemblies positioned on opposite sides of said doorway and facing opposed sides of said stencil mask presented to that chamber after passage of said mask frame carrier through said doorway, said chamber further comprising a pair of generally rectangular manifold air duct loops on respective sides of said doorway, each rectangular manifold air duct loop facing a different side of the mask frame borne by said mask frame carrier, slots being provided within the surface of the manifold air duct loops facing said mask frame, tubular air nozzles fixed to said manifold air duct loops, said air nozzles opening to the interior of said manifold air duct loop and having mesh covered ends facing the surfaces of said mask, such that forced air flow through said manifold air duct loop causes concentrated air flow against the sides of the mask.

21. The apparatus as claimed in claim 20, wherein each of said rectangular manifold air duct loop comprise four right angled end-to-end joined cylindrical duct sections, and wherein at least one of the cylindrical duct sections comprises an inclined mesh wall extending in a diametric plane through the center of said duct such that forced air is directed onto the mask in concentrated regulated streams relative to the plane of the mask borne by the arms of said mask frame carrier.

* * * * *